United States Patent
Abdolvand

(10) Patent No.: US 10,994,369 B2
(45) Date of Patent: May 4, 2021

(54) METHOD OF REDUCING PHOTOELECTRON YIELD AND/OR SECONDARY ELECTRON YIELD OF A CERAMIC SURFACE; CORRESPONDING APPARATUS AND PRODUCT

(71) Applicant: University of Dundee, Dundee (GB)

(72) Inventor: Amin Abdolvand, Dundee (GB)

(73) Assignee: UNIVERSITY OF DUNDEE, Dundee (GB)

( * ) Notice: Subject to any disclaimer, the term of this patent is extended or adjusted under 35 U.S.C. 154(b) by 191 days.

(21) Appl. No.: 16/082,163

(22) PCT Filed: Mar. 8, 2017

(86) PCT No.: PCT/GB2017/050621
§ 371 (c)(1),
(2) Date: Sep. 4, 2018

(87) PCT Pub. No.: WO2017/153750
PCT Pub. Date: Sep. 14, 2017

(65) Prior Publication Data
US 2019/0084081 A1 Mar. 21, 2019

(30) Foreign Application Priority Data

Mar. 8, 2016 (GB) .................................. 1603991

(51) Int. Cl.
*B23K 26/352* (2014.01)
*B23K 26/362* (2014.01)
(Continued)

(52) U.S. Cl.
CPC ...... *B23K 26/0626* (2013.01); *B23K 26/0006* (2013.01); *B23K 26/04* (2013.01);
(Continued)

(58) Field of Classification Search
CPC ........ B23K 2103/52; B23K 26/36–364; B23K 26/352–3584; B23K 26/062–0624;
(Continued)

(56) References Cited

U.S. PATENT DOCUMENTS 5,483,038 A  1/1996 Ota et al.
6,407,363 B2 6/2002 Dunsky et al.
(Continued)

FOREIGN PATENT DOCUMENTS

CN  102369081  3/2012
CN  102792193  11/2012
(Continued)

OTHER PUBLICATIONS

Russian Office Action and Search Report corresponding to RU 2018102523, dated Dec. 23, 2019 (11 pages to include English translation of Search Report).
(Continued)

*Primary Examiner* — Michael A Laflame, Jr.
(74) *Attorney, Agent, or Firm* — Myers Bigel, P.A

(57) ABSTRACT

A method of reducing photoelectron yield (PEY) and/or secondary electron yield (SEY) of a ceramic surface comprises applying pulsed laser radiation comprising a series of laser pulses emitted by a laser (4) to the surface of a target (10) to produce a periodic arrangement of structures on the surface of the target (10).

29 Claims, 24 Drawing Sheets

(51) Int. Cl.

| | |
|---|---|
| *B23K 26/36* | (2014.01) |
| *B23K 26/06* | (2014.01) |
| *B23K 26/0622* | (2014.01) |
| *B23K 26/00* | (2014.01) |
| *B23K 26/082* | (2014.01) |
| *B23K 26/04* | (2014.01) |
| *B23K 26/40* | (2014.01) |
| *H01L 21/768* | (2006.01) |
| *H01L 23/525* | (2006.01) |
| *B23K 101/36* | (2006.01) |
| *B23K 103/00* | (2006.01) |
| *B23K 103/14* | (2006.01) |
| *B23K 103/10* | (2006.01) |
| *B23K 103/04* | (2006.01) |
| *B23K 103/12* | (2006.01) |
| *B23K 101/32* | (2006.01) |

(52) U.S. Cl.
CPC ........ *B23K 26/0624* (2015.10); *B23K 26/082* (2015.10); *B23K 26/352* (2015.10); *B23K 26/3584* (2018.08); *B23K 26/40* (2013.01); *H01L 21/76894* (2013.01); *H01L 23/5258* (2013.01); *B23K 2101/32* (2018.08); *B23K 2101/36* (2018.08); *B23K 2103/05* (2018.08); *B23K 2103/10* (2018.08); *B23K 2103/12* (2018.08); *B23K 2103/14* (2018.08); *B23K 2103/52* (2018.08)

(58) Field of Classification Search
CPC ........ B23K 26/073–0738; B23K 26/32; B23K 26/324; B23K 26/082; B23K 26/34–342
See application file for complete search history.

(56) References Cited

U.S. PATENT DOCUMENTS

| | | | |
|---|---|---|---|
| 6,518,540 B1* | 2/2003 | Wee ................. | B23K 26/361 |
| | | | 219/121.61 |
| 6,670,571 B2 | 12/2003 | Dance | |
| 7,628,865 B2 | 12/2009 | Singh | |
| 8,743,165 B2 | 6/2014 | Sandström | |
| 9,409,254 B2 | 8/2016 | Hackel | |
| 9,413,137 B2 | 8/2016 | Haden et al. | |
| 10,315,278 B2* | 6/2019 | Wang ................. | B23K 37/0435 |
| 2007/0199927 A1 | 8/2007 | Gu | |
| 2007/0236130 A1 | 10/2007 | Ito et al. | |
| 2008/0216926 A1 | 9/2008 | Guo | |
| 2009/0268265 A1 | 10/2009 | Shah et al. | |
| 2010/0176101 A1* | 7/2010 | Costin ............... | C03C 23/0025 |
| | | | 219/121.69 |
| 2011/0089039 A1 | 4/2011 | Nashner | |
| 2012/0015118 A1 | 1/2012 | Zheludev | |
| 2012/0018993 A1 | 1/2012 | Boegli | |
| 2012/0243094 A1 | 9/2012 | Boegli | |
| 2013/0017948 A1 | 1/2013 | Charlson | |
| 2013/0020297 A1 | 1/2013 | Gupta | |
| 2013/0083500 A1 | 4/2013 | Prest | |
| 2013/0126573 A1* | 5/2013 | Hosseini ........... | B23K 26/0622 |
| | | | 225/2 |
| 2013/0143013 A1 | 6/2013 | Reichenbach | |
| 2013/0208074 A1 | 8/2013 | Zhang | |
| 2013/0251960 A1 | 9/2013 | Zhang | |
| 2014/0083984 A1 | 3/2014 | Gerke | |
| 2014/0147694 A1 | 5/2014 | Harrison | |
| 2014/0154526 A1 | 6/2014 | Guo | |
| 2014/0175067 A1 | 6/2014 | Reichenbach et al. | |
| 2014/0185065 A1 | 7/2014 | Shah | |
| 2015/0049593 A1 | 2/2015 | Oliveira | |
| 2015/0290744 A1* | 10/2015 | Bilhe ................. | B41M 5/24 |
| | | | 264/400 |
| 2016/0167170 A1* | 6/2016 | Terasaki ............ | B23K 35/286 |
| | | | 219/121.61 |
| 2016/0169531 A1* | 6/2016 | Wagner ............. | B32B 5/142 |
| | | | 428/172 |
| 2017/0021654 A1* | 1/2017 | Bilhe ................. | B23K 26/0622 |
| 2017/0292190 A1* | 10/2017 | Montero Herrero | ... G21F 1/125 |
| 2018/0142338 A1* | 5/2018 | Yokota .............. | B23K 26/352 |
| 2018/0178319 A1 | 6/2018 | Abdolvand | |
| 2018/0238178 A1* | 8/2018 | Lampenscherf ...... | F01D 9/041 |

FOREIGN PATENT DOCUMENTS

| | | |
|---|---|---|
| CN | 103586578 | 2/2014 |
| EP | 2338681 | 6/2011 |
| GB | 2527291 A | 12/2015 |
| JP | 2000311632 A | 11/2000 |
| JP | 2002287191 | 10/2002 |
| JP | 2013529548 A | 7/2013 |
| JP | 2014133263 A | 7/2014 |
| KZ | 18694 | 12/2009 |
| KZ | 17540 | 1/2010 |
| KZ | 23611 | 12/2010 |
| RU | 2094225 | 10/1997 |
| RU | 2268814 | 1/2006 |
| RU | 2433896 | 11/2009 |
| RU | 2447012 | 4/2012 |
| WO | 2013151451 | 10/2013 |
| WO | 2015189645 | 12/2015 |

OTHER PUBLICATIONS

PCT International Search Report dated Jul. 13, 2017 for corresponding PCT International Application No. PCT/GB2017/050621 (5 pages).

PCT Written Opinion dated Jul. 13, 2017 for corresponding PCT International Application No. PCT/GB2017/050621 (4 pages).

"Ultra-Intense Laser Blast Creates True 'Black Metal'", Rochester News, University of Rochester, Nov. 21, 2006 (2 pages).

Baglin, "The Secondary Electron Yield of Technical Materials and its Variation with Surface Treatments", Proceedings of EPAC 2000, Vienna, Austria, pp. 217-221).

Cern Bulletin, Issue No. 24-25/2014, Jun. 9, 2014, Particle Kickers (2 pages).

Chunlei Guo, group webpage, http://www2.optics.rochester.edu/workgroups/guo/about.html, (2 pages).

Dominguez et al., "First Electron-Cloud Studies at the Large Hadron Collider", Physical Review Special Topics—Accelerators and Beams, 16, 011003-1-011003-18, (2013).

Ducimetiere et al., "The LHC Injection Kicker Magnet", Proceedings of the 2003 Particle Accelerator Conference, pp. 1162-1164.

Fan et al., "Rapid Fabrication of Surface Micro/Nano Structures with Enhanced Broadband Absorption on Cu by Picosecond Laser", Optics Express, vol. 21, No. 10, May 20, 2013, pp. 11628-11637.

Goudket et al., "Surface Resistance RF Measurements of Materials Used for Accelerator Vacuum Chambers", 6th International Particle Accelerator Conference, IPAC2015, Richmond, VA, pp. 3235-3238.

John H. Booske, "Plasma Physics and Related Challenges of Millimeter-Wave-to-Terahertz and High Power Microwave Generation", Physics of Plasmas, 15, 055502-1-055502-16 (2008).

Li et al., "Influence of Surface Morphology on Corrosion and Electronic Behavior", Acta Materialia, 54, pp. 445-452, (2006).

PCT International Search Report and Written Opinion issued for corresponding International Application No. PCT/GB2016/051908, dated Oct. 7, 2016 (14 pages).

PCT International Search Report and Written Opinion issued for corresponding International Application No. PCT/GB2016/051909, dated Oct. 12, 2016 (14 pages).

PCT International Search Report and Written Opinion issued for corresponding International Application No. PCT/GB2017/050621, dated Jul. 13, 2017 (12 pages).

Penide et al., "High Contrast Laser Marking of Alumina", Applied Surface Science, 336 (2015), pp. 118-128.

Pivi et al., "Sharp Reduction of the Secondary Electron Emission Yield from Grooved Surfaces", Journal of Applied Physics, 104, 104904-1-104904-10.

(56) References Cited

OTHER PUBLICATIONS

Tang et al., "Nanosecond Pulsed Laser Blackening of Copper", Applied Physics Letters, 101, 231902-1-231902-4, (2012).

Valizadeh et al., "Low Secondary Electron Yield Engineered Surface for Electron Cloud Mitigation", Applied Physics Letters, 105, 231605-1-231605-5 (2014).

Valizadeh et al., "Low Secondary Electron Yield of Laser Treated Surfaces of Copper, Aluminium and Stainless Steel", Proceedings of IPAC2016, Busan, Korea, pp. 1089-1092.

Vorobyev et al., "Colorizing Metals with Femtosecond Laser Pulses", Applied Physics Letters, 92, 041914-1-041914-3, (2008).

Vorobyev et al., "Enhanced Absorptance of Gold Following Multipulse Femtosecond Laser Ablation", Physical Review B, 72, 195422-1-195422-5 (2005).

Vorobyev et al., "Enhanced Absorption of Metals Over Ultrabroad Electromagnetic Spectrum", Applied Physics Letters, 95, 121106-1-121106-3 (2009).

Vorobyev et al., "Femtosecond Laser Blackening of Platinum", Journal of Applied Physics, 104, 053516-1-053516-4, (2008).

Walker et al., "The Secondary Electron Emission Yield for 24 Solid Elements Excited by Primary Electrons in the Range 250-5000 ev: A Theory/Experiment Comparison", Scanning vol. 30, pp. 365-380, (2008).

Yang et al., "Ultra-Broadband Enhanced Absorption of Metal Surfaces Structured by Femtosecond Laser Pulses", Optics Express, vol. 16, No. 15, Jul. 21, 2008, pp. 11259-11265.

Examination Report dated Mar. 13, 2019 for European Application No. 16741107.3 (5 pages).

PCT International Preliminary Report on Patentability issued for corresponding International Application No. PCT/GB2017/050621, dated Sep. 20, 2018 (6 pages).

Indian Office Action corresponding to IN 201817037125; dated Oct. 27, 2020 (8 pages).

\* cited by examiner

Argon – 0.74 TW/cm$^2$

Argon – 0.88 TW/cm$^2$

Argon – 0.95 TW/cm²

Argon – 2 TW/cm²

Argon – 1.3 TW/cm²

Air – 0.3 TW/cm²

Argon – 0.4 TW/cm²

Argon – 2 TW/cm²

Air – 0.6 TW/cm$^2$

Air – 1 TW/cm$^2$

Air – 0.25 GW/cm²

Air – 0.35 GW/cm²

Air – 0.45 GW/cm²

Air – 0.55 GW/cm²

Argon – 0.6 GW/cm²

Argon – 0.65 GW/cm²

Argon – 0.7 GW/cm²

Argon – 0.75 GW/cm²

Argon – 0.8 GW/cm²

Argon – 0.85 GW/cm²

Argon – 0.9 GW/cm²

Argon – 0.95 GW/cm²

Argon – 1 GW/cm²

Argon – 1.5 GW/cm²

METHOD OF REDUCING PHOTOELECTRON YIELD AND/OR SECONDARY ELECTRON YIELD OF A CERAMIC SURFACE; CORRESPONDING APPARATUS AND PRODUCT

RELATED APPLICATIONS

This application is a 35 U.S.C. § 371 national stage application of PCT Application No. PCT/GB2017/050621, filed on Mar. 8, 2017, which claims priority from Great Britain Patent Application No. 1603991.9, filed on Mar. 8, 2016, the contents of which are incorporated herein by reference in their entireties. The above-referenced PCT International Application was published in the English language as International Publication No. WO 2017/153750 A1 on Sep. 14, 2017.

The present invention relates to methods of, and apparatus for, processing ceramic surfaces in order to reduce photoelectron yield (PEY) and/or secondary electron yield (SEY).

BACKGROUND

Photoelectron emission (PEE) refers to the emission of electrons due to interaction of photons with a surface. Secondary electron emission (SEE) refers to emission of a secondary electron from a surface due to interaction of a primary electron with the surface. Photoelectron yield (PEY) can be used to characterise PEE and secondary electron yield (SEY) can be used to characterise SEE. PEY and SEY may be taken to be the average number of emitted electrons per single incident photon or electron respectively.

PEE and SEE effects can cause significant difficulties in a wide variety of apparatus, for example in particle accelerators, beamlines, waveguides, for example r.f. waveguides, detectors, spacecraft, and vacuum chambers. PEE and SEE effects can lead, variously, to undesired electron cloud build-up, undesired increases in pressure, beam losses and instability, reduction in beam lifetimes, undesired heat loads, power loss, damage, reduction in apparatus lifetime, increase in noise, and decrease in sensitivity, depending on the particular type of apparatus and application in question.

The reduction of SEY or PEY for ceramic materials, such as >99.5% pure aluminium oxide (alumina), for example 99.7% pure alumina used for Kickers in accelerator beam transfer (Injection Kicker Systems) can be particularly challenging as, for example, SEY values may be significantly higher (for example 8 or above) than desired for some practical applications (for example less than 2, or less than 1.6 or even 1.4 in some cases). Although $Al_2O_3$ is generally referred to as aluminium oxide or alumina, it is also known in the art to refer to it as alumina oxide.

It is desired to provide improved or at least alternative methods for reducing PEY and SEY.

SUMMARY

In a first aspect of the invention there is provided a method of reducing photoelectron yield (PEY) and/or secondary electron yield (SEY) of a ceramic surface, comprising applying laser radiation to the surface to produce a periodic arrangement of structures on the surface.

The laser radiation may comprise pulsed laser radiation comprising a series of laser pulses. A ceramic material, for example the ceramic surface, may comprise metallic and non-metallic atoms joined by ionic bonds and/or covalent bonds, for example a mixture of ionic bonds and covalent bonds.

The power density of the laser radiation, for example of the pulses, may be in the $TW/cm^2$ range, optionally in a range 0.1 $TW/cm^2$ to 3 $TW/cm^2$. Optionally the power density may be in a range 0.5 $TW/cm^2$ to 1.5 $TW/cm^2$.

Alternatively, power density of the laser radiation, for example of the pulses, may be in the $GW/cm^2$ range, optionally in a range 0.1 $GW/cm^2$ to 3 $GW/cm^2$. Optionally the power density may be in a range 0.2 $GW/cm^2$ to 1 $GW/cm^2$.

By using laser pulses having such power densities in the $TW/cm^2$ range or in the $GW/cm^2$ range, a periodic arrangement of structures that provides a surface with desired electron work function properties may be obtained. For example a surface having a desired value or range of values of secondary electron yield (SEY) may be obtained.

The method may alter the properties of surface such that the surface has a value of SEY less than 2.5, optionally less than 2.0, optionally less than or equal to 1.6, optionally less than or equal to 1.4, optionally in a range 0.2 to 2.0, optionally in a range 0.5 to 1.6, optionally in a range 1.0 to 1.4.

The laser pulses may have a duration less than a thermal relaxation time of the material of the surface. The laser pulses may have a duration such that the electrons and the atomic lattice of the material of the surface have a substantially different temperature substantially throughout application of the laser pulses. The laser pulses may have a duration such that material of the surface is at least one of evaporated or vaporised or removed without substantial melting and/or flowing of the surface. The laser pulses may have a duration such that some material of the surface is at least one of evaporated or vaporised or removed without substantial melting and/or flowing of the remaining material of the surface.

A pulse duration of the laser pulses may be in a range 300 femtoseconds (fs) to 1 nanosecond (ns).

A pulse duration of the laser pulses may be in a range 1 ns to 100 ns.

The periodic arrangement of structures on the surface may comprise a periodic series of peaks and troughs substantially parallel to each other, and the peaks may be substantially flat on top and/or may be rounded on top and/or may have substantially no pointed and/or or sharp regions on top. The peaks may substantially have a top hat shape and/or a truncated pyramidal shape, for example a top hat shape and/or a truncated pyramidal shape in cross-sectional profile. Thus, for example, a desired value of electron work function and/or desired electron trapping properties may be obtained. The peaks may extend in a longitudinal direction and may be referred to as ridges.

The peak to trough distance for at least some of the peaks, and/or an average or median peak to trough distance, may be in a range 1 μm to 100 μm, optionally in a range 20 μm to 80 μm, optionally in a range 30 μm to 60 μm.

The periodic arrangement of structures may comprise a cross-hatched arrangement or an arrangement of substantially parallel lines of peaks and troughs (for example, ridges and valleys) substantially without cross-hatching. The periodic arrangement of structures may, for example, be produced by a single pass of a laser source that provided the laser radiation.

The ceramic surface may be on an at least one underlying layer and the laser radiation may be such as to substantially not remove or move material of the surface in such a way as to expose the underlying layer.

In a further aspect of the invention, which may be provided independently, there is provided a ceramic laser treated surface comprising a laser-formed periodic arrangement of structures on the ceramic surface, wherein at least one of:

the periodic arrangement of structures comprises a periodic series of peaks and troughs substantially parallel to each other;

the periodic arrangement of structures comprises a cross-hatched, periodic series of peaks and troughs; and optionally the peaks may be substantially flat on top and/or may be rounded on top and/or may have substantially no pointed and/or or sharp regions on top and/or the peaks may substantially have a top hat shape and/or a truncated pyramidal shape, for example a top hat shape and/or a truncated pyramidal shape in cross-sectional profile; and/or the peak to trough distance for at least some of the peaks, and/or an average or median peak to trough distance, may be in a range 1 μm to 100 μm, optionally in a range 20 μm to 80 μm, optionally in a range 30 μm to 60 μm.

In a further aspect of the invention, which may be provided independently, there is provided an apparatus for reducing photoelectron yield (PEY) and/or secondary electron yield (SEY) of a ceramic surface, comprising:

a laser source for applying pulsed laser radiation to a surface; and a laser controller configured to control the laser source to apply the laser radiation as a series of laser pulses thereby to form a periodic arrangement of structures on the surface. The power density of the pulses may be in the TW/cm$^2$ range or in the GW/cm$^2$ range. The power density of the pulses may be a range 0.1 TW/cm$^2$ to 3 TW/cm$^2$. The power density of the pulses may be a range 0.1 GW/cm$^2$ to 3 GW/cm$^2$.

In a further aspect of the invention, there is provided a method of reducing photoelectron yield (PEY) and/or secondary electron yield (SEY) of a ceramic surface, comprising:

applying laser radiation to the surface to produce a periodic arrangement of structures on the ceramic surface, wherein the laser radiation comprises pulsed laser radiation comprising a series of laser pulses, and a pulse duration of the laser pulses is in a range 300 fs to 1 ns or in a range 1 ns to 100 ns.

The surface may be the surface of a target.

The pulse duration may be in a range 1 ps to 100 ps. The pulse duration may be in a range 1 ps to 50 ps. The pulse duration may be in a range 5 ps to 500 ps The laser radiation may comprise a pulsed laser beam that has a focal spot diameter on the surface in a range 5 μm to 100 μm or in a range 1 μm to 100 μm.

The pulsed radiation may have a pulse repetition rate in a range 10 kHz to 1 MHz, optionally in a range 10 KHz to 200 kHz.

An average power of the laser radiation may be in a range 3 W to 8 W or in a range 1 W to 10 W. An average power of the laser radiation may be in a range 0.3 W to 2 W, or in a range 1 W to 5 W, or in a range 0.1 W to 1 W, or in a range 0.1 W to 2 W, or in a range 0.3 W to 5 W.

The applying of the laser radiation to the surface may comprise scanning a pulsed laser beam over the surface, and a scan speed for the scanning may be in a range 1 mm/s to 100 mm/s or in a range 10 mm/s to 50 mm/s.

The scanning of the pulsed laser beam over the surface may be repeated between 2 and 10 times, or may be performed once.

An angle of incidence of the laser radiation to the surface may be in a range from 0 to 30 degrees. The angle of incidence of the laser radiation to the surface may be in a range from 90 degree to 60 degrees.

A wavelength of the radiation may be in a range 100 nm to 2,000 nm, optionally 355 nm or 532 nm or 1064 nm.

The structures may comprise peaks and troughs. The periodic arrangement of structures may comprise a periodic series of peaks and troughs. The peaks and troughs may be substantially parallel to each other.

The periodic arrangement of structures may comprise a first series of peaks and troughs arranged in a first direction, and a second series of peaks and troughs arranged in a second, different direction. The first and second directions may be substantially orthogonal. The first series of peaks and troughs and the second series of peaks and troughs may intersect such that the periodic arrangement of structures comprises a cross-hatched arrangement.

A period of the periodic arrangement may be in a range 0.5 μm to 100 μm. The separation of adjacent peaks (or troughs) of the periodic structure may be in a range 0.5 μm to 100 μm.

A hatch distance of the cross-hatched arrangement may be in a range 0.5 μm to 100 μm, optionally in a range 10 μm to 100 μm.

The laser radiation may be such that the applying of the laser radiation to the surface comprises producing further structures. The further structures may be smaller than the structures of the periodic arrangement of structures.

That feature may be particularly important, so in a second aspect of the invention, which may be provided independently, there is provided a method of reducing photoelectron yield (PEY) and/or secondary electron yield (SEY) of a ceramic surface, comprising:

applying laser radiation to the surface to produce a periodic arrangement of structures on the surface, wherein the laser radiation comprises pulsed laser radiation comprising a series of laser pulses, and the laser radiation is such as to produce further structures on the surface as well as the periodic arrangement of structures.

The further structures may comprise further periodic structures. The further structures may comprise ripples. The further structures may comprise nano-ripples. The further structures may be further periodic structures. The further structures may comprise laser induced periodic surface structures (LIPPS), for example with periodicity in the range of the laser wavelength. The further structures may have a periodicity in a range 10 nm to 1 μm, optionally in a range 100 nm to 1 μm.

The further structures may cover at least part of the periodic array of structures. The further structures may be formed in the troughs and/or on the peaks of the periodic arrangement of structures.

The ceramic surface and/or target may comprise alumina. For example, >99.5% pure alumina oxide used for Kickers in accelerator beam transfer (Injection Kicker Systems).

The ceramic surface and/or target may comprise any suitable magnetic, conductive or dielectric ceramic material.

The surface and/or target may comprise a ceramic material having a spinel structure, for instance a spinel structure having the formula $M(Fe_2O_4)$ where M is a covalent cation.

M may be a covalent cation selected from the group manganese ($Mn^{2+}$), nickel ($Ni^{2+}$), cobalt ($Co^{2+}$), zinc ($Zn^{2+}$), copper ($Cu^{2+}$), magnesium ($Mg^{2+}$). Alternatively M may represent a monovalent cation, for example lithium ($Li^+$) or even a vacancy or vacancies, for instance in the case where such absences of positive charge may be compensated for by additional trivalent iron cations ($Fe^{3+}$).

The surface and/or target may comprise a ferrite material, for example a hexagonal ferrite material, for instance a material having a structure $M(Fe_{12}O_{19})$. M may be selected from the group barium (Ba), strontium (Sr), lead (Pb).

The surface and/or target may comprise a garnet ferrite material, for instance having the structure of the silicate mineral garnet, and for example having the chemical formula $M_3(Fe_5O_{12})$ where M may be ytrrium or a rare earth ion.

The surface and/or target may comprise a thick- or thin-film resistor or electrode or capacitor or a material that may be suitable for use as or as part of such thick- or thin-film resistor or electrode or capacitor. The surface and/or target may comprise a metal oxide material, for instance a material selected from the group, lead oxide (PbO), ruthenium dioxide ($RuO_2$), bismuth ruthenate ($Bi_2Ru_2O_7$). The surface and/or target may comprise a ceramic material having overlapping energy bands.

The surface and/or target may comprise a ceramic conductor. For instance, the surface and/or target may comprise indium oxide ($In_2O_3$) and/or tin oxide ($SnO_2$) or indium tin oxide (ITO).

The surface and/or target may comprise a heating element or a material that may be suitable for use as or as part of such a heating element. The surface and/or target may comprise material selected from the group silicon carbide (SiC), molybdenum disilicide ($MoSi_2$), lanthanum chromite ($LaCr_2O_4$), zirconia ($ZrO_2$).

The surface and/or target may comprise a thermistor or a material that may be suitable for us as or as part of such a thermistor. The surface and/or target may comprise material selected from the group consisting of iron spinel material, cobalt spinel material and manganese spinel material.

The surface and/or target may comprise a superconductor material, for example yttrium barium copper oxide ($YBa_2Cu_3O_7$), a bismuth-strontium-calcium-copper oxide material (for example $Bi_2Sr_2CuO_6$, $Bi_2Sr_2CaCu_2O_8$, or $Bi_2Sr_2Ca_2Cu_3O_{10}$), a thallium-barium-calcium-copper oxide material (for example $Tl_2Ba_2CuO_6$, $Tl_2Ba_2CaCu_2O_8$, $Tl_2Ba_2Ca_2Cu_3O_{10}$, or $TlBa_2Ca_3Cu_4O_{11}$) or a mercury-barium-calcium-copper oxide material (for example $HgBa_2CuO_4$, $HgBa_2CaCu_2O_6$, or $HgBa_2Ca_2Cu_3O_8$).

The surface and/or target may comprise a perovskite material. The surface and/or target may comprise barium titanate ($BaTiO_3$) or barium titanate including non-stoichiometric lead, strontium or calcium substitutions.

The surface may form part of a laminated structure, for example a laminated target, for instance comprising alumina and at least one other material.

An average or peak fluence or other property of the laser radiation may be above an ablation threshold, and/or in the range of thermal threshold of the surface and/or within 105%, optionally 102%, optionally 101% of the ablation threshold.

The pulses may be such that, for each pulse, a plasma is formed at the surface. The plasma may have substantially the same density as underlying material of the surface.

The surface may form part of a particle accelerator, an injection kicker system, a beamline, a waveguide for example an r.f. waveguide, a detector, a detector apparatus, or a spacecraft.

The surface may comprise or form part of a surface of a vacuum chamber.

The surface may comprise a surface of a component of an apparatus. The apparatus may be selected from: a particle accelerator, a beam kicker magnet (the component may for example comprise a ceramic plate capacitor or ceramic liner pipe), a beamline, a waveguide for example an r.f. waveguide, a detector, a detector apparatus, a spacecraft. The method may comprise applying the laser radiation to the surface to produce the periodic arrangement of structures on the surface and then installing the component in the apparatus, or the method may comprise applying the laser radiation to the surface with the component in situ in the apparatus.

The method may comprise applying the radiation using a pulsed solid-state bulk laser, optionally the solid state laser comprises a Nd:$YVO_4$ or Nd:YAG or Yb:KYW or Yb:KGW laser, or a pulsed fibre laser, optionally a Yb, Tm or Nd-doped pulsed solid-state fibre laser.

The method may comprise forming a metal layer on at least part of the surface after the applying of the laser radiation.

The method may comprise substantially covering the periodic structures with the metal layer. The metal layer may be formed using any suitable process, for example a coating process.

The metal layer may comprise gold or any other suitable metal, for example silver, copper or aluminium. The metal layer may comprise elemental metal, for example elemental gold, silver, copper or aluminium, or may comprise a metal alloy or metallic compound.

The metal layer may have a thickness in a range 0.1 nm to 100 nm, optionally 1 nm to 50 nm, optionally 1 nm to 20 nm. The metal layer may have a substantially constant thickness. The metal layer may have a thickness such as to maintain the morphology of the surface, for example to maintain the surface to have substantially the same cross-sectional profile as before the formation of the metal layer. For instance the metal layer may have a thickness such as to maintain substantially the same distribution of laser-formed troughs and peaks at the surface as before the formation of the metal layer, and/or such as to not completely fill in gaps between surface features, for example the troughs and/or peaks or other laser-formed surface features.

The method may comprise at least one of degreasing, cleaning or smoothing the surface after the applying of the laser radiation and/or performing a surface carbon reduction process with respect to said surface after the applying of the laser radiation.

In a further aspect of the invention, which may be provided independently, there is provided an apparatus for reducing photoelectron yield (PEY) and/or secondary electron yield (SEY) of a surface, comprising:
  a laser source for applying pulsed laser radiation to a surface; and
  a laser controller configured to control the laser source to apply the laser radiation as a series of laser pulses having a pulse duration in a range 200 femtoseconds (fs) to 1000 ps, so as to produce a periodic arrangement of structures on the surface.

In a further aspect of the invention, which may be provided independently, there is provided an apparatus for reducing photoelectron yield (PEY) and/or secondary electron yield (SEY) of a ceramic surface, comprising:

a laser source for applying pulsed laser radiation to a surface and configured to operate so as to perform a method according to any other aspect.

In a further aspect of the invention, which may be provided independently there is provided a laser treated ceramic surface comprising a periodic arrangement of structures on the surface formed using a method according to any other aspect.

The surface may further comprise a metal layer covering at least part, optionally substantially all, of the periodic arrangement of structures and/or of the surface. Thus, at least part optionally all of the outer part of the ceramic surface may comprise metal.

In a further aspect of the invention, which may be provided independently, there is provided a laser treated ceramic surface comprising a laser-formed periodic arrangement of structures on the ceramic surface and further laser-formed structures on the ceramic surface.

The further structures may comprise further periodic structures. The further structures may comprise ripples. The further structures may comprise nano-ripples. The further structures may be further periodic structures. The further structures may comprise laser induced periodic surface structures (LIPPS). The further structures may have a periodicity in a range 10 nm to 1 µm, optionally in a range 100 nm to 1 µm.

The structures may comprise peaks and troughs. The periodic arrangement of structures may comprise a periodic series of peaks and troughs. The peaks and troughs may be substantially parallel to each other.

The periodic arrangement of structures may comprise a first series of peaks and troughs arranged in a first direction, and a second series of peaks and troughs arranged in a second, different direction. The first and second directions may be substantially orthogonal. The first series of peaks and troughs and the second series of peaks and troughs may intersect such that the periodic arrangement of structures comprises a cross-hatched arrangement.

A period of the periodic arrangement may be in a range 0.5 µm to 100 µm. The separation of adjacent peaks (or troughs) of the periodic structure may be in a range 0.5 µm to 100 µm. A hatch distance of the cross-hatched arrangement may be in a range 0.5 µm to 100 µm.

The further structures may comprise further periodic structures. The further structures may comprise ripples. The further structures may comprise nano-ripples. The further structures may be further periodic structures. The further structures may comprise laser induced periodic surface structures (LIPPS). The further structures may have a periodicity in a range 10 nm to 1 µm, optionally in a range 100 nm to 1 µm.

The further structures may cover at least part of the periodic array of structures. The further structures may be formed in the troughs of the periodic arrangement of structures.

The surface may comprise alumina. The surface may form part of a laminated structure, for example a laminated target, for instance comprising alumina or other ceramic and at least one other material.

In a further aspect of the invention, which may be provided independently, there is provided a method of modifying a ceramic surface by applying laser radiation to the surface to modify the surface by way of a photo-thermal interaction and/or a photo-ablation interaction.

In another aspect of the invention, which may be provided independently, there is provided a ceramic surface modified by way of a photo-thermal interaction and/or a photo-ablation interaction obtained by applying laser radiation to the surface.

In a further aspect of the invention, which may be provided independently, there is provided a particle accelerator, an injection kicker system, a beam kicker magnet, a beamline, a waveguide, a detector, a spacecraft, or a vacuum chamber that includes a component having a ceramic surface according to any of the other aspects or formed according to any of the other aspects.

In further aspects of the invention there are provided a method, a surface, a structure comprising a surface, an apparatus, a component, a particle accelerator, an injection kicker system, a beam kicker magnet, a beamline, a waveguide, a detector, a spacecraft, or a vacuum chamber as described and/or illustrated herein.

Any feature in any one or more of the aspects of the invention may be applied to any other one or more of the aspects of the invention in any appropriate combination.

BRIEF DESCRIPTION OF THE DRAWINGS

Embodiments of the invention are further described hereinafter with reference to the accompanying drawings, in which.

DETAILED DESCRIPTION

Figure 1:
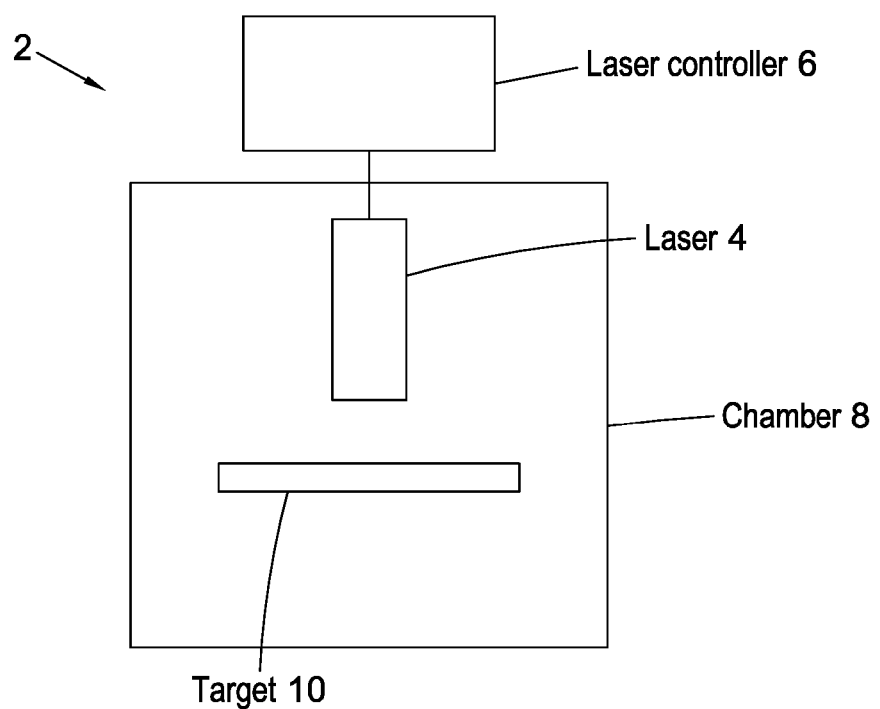
FIG. 1 is a schematic diagram of a system used for laser treatment of a surface to reduce photoelectron emission (PEE) and/or secondary electron emission (SEE) effects, for example to reduce photoelectron yield (PEY) and/or secondary photoelectron yield (SEY)

FIG. 1 shows a system used for laser treatment of a surface to reduce photoelectron emission (PEE) and/or secondary electron emission (SEE) effects, for example to reduce photoelectron yield (PEY) and/or secondary electron yield (SEY).

The system 2 of FIG. 1 comprises a laser 4 connected to a laser controller 6 which is used to control operation of the laser 4 to emit a pulsed laser radiation beam of desired characteristics. The laser 4 is aligned with a target 8 such that operation of the laser 4 under control of the laser controller 6 forms periodic structures on the surface of the target.

In embodiments, the laser may be one of a pulsed Nd:YVO$_4$ or Nd:YAG or Yb:KYW or Yb:KGW solid-state bulk laser, or a pulsed fibre laser, optionally a Yb, Tm or Nd-doped pulsed solid-state fibre laser. Any other suitable laser may be used in alternative embodiments. In the embodiment of FIG. 1, the wavelength of the pulsed laser radiation is 532 nm, but any other suitable wavelength can be used in other embodiments, for example 1064 nm or 355 nm.

The controller may comprise a dedicated controller, or a suitably programmed computer. The controller may be implemented in software, hardware or any suitable combination of hardware and software. In some embodiments, the controller may comprise more ASICs (application specific integrated circuits) or FPGAs (field programmable gate arrays) or other suitable circuitry.

In the embodiment of FIG. 1, the target 8 and laser 4 are located in air and the laser treatment of the surface is performed in air. The target 8 and laser 4 may be positioned in a sealable and/or pumpable chamber 10 that has an associated pump and/or gas supply, and the laser processing of the surface may be performed in vacuum or in desired gaseous conditions, for example in the presence of a selected reactive gas or inert gas. The chamber 10 is omitted in some embodiments.

In the embodiment of FIG. 1, the target is a ceramic target comprising alumina, for example 99.5% or greater than 99.5% pure alumina. Other ceramic targets may be used in other embodiments. For instance, the target may comprise any suitable magnetic, conductive or dielectric ceramic material.

For instance, the target may comprise a ceramic material having a spinel structure, for instance a spinel structure having the formula M(Fe$_2$O$_4$) where M is a covalent cation. M may be a covalent cation selected from the group manganese (Mn$^{2+}$), nickel (Ni$^{2+}$), cobalt (Co$^{2+}$), zinc (Zn$^{2+}$), copper (Cu$^{2+}$), magnesium (Mg$^{2+}$). Alternatively M may represent a monovalent cation, for example lithium (Li$^+$) or even a vacancy or vacancies, for instance in the case where such absences of positive charge may be compensated for by additional trivalent iron cations (Fe$^{3+}$).

Alternatively, in some embodiments the ceramic target may comprise a ferrite material, for example a hexagonal ferrite material, for instance a material having a structure M(Fe$_{12}$O$_{19}$). M may be selected from the group barium (Ba), strontium (Sr), lead (Pb).

In other embodiments, the ceramic target may comprise a garnet ferrite material, for instance having the structure of the silicate mineral garnet, and for example having the chemical formula M$_3$(Fe$_5$O$_{12}$) where M may be yttrium or a rare earth ion.

In some embodiments, the ceramic target may comprise a thick- or thin-film resistor or electrode or a material that may be suitable for use as or as part of such thick- or thin-film resistor or electrode. In embodiments, the ceramic target may comprise a metal oxide material, for instance a material selected from the group, lead oxide (PbO), ruthenium dioxide (RuO$_2$), bismuth ruthenate (Bi$_2$Ru$_2$O$_7$). The ceramic target may comprise a ceramic material having overlapping energy bands.

In other embodiments, the target may comprise a ceramic conductor. For instance, the target may comprise indium oxide (In$_2$O$_3$) and/or tin oxide (SnO$_2$) or indium tin oxide (ITO).

In embodiments, the ceramic target may comprise a heating element or a material that may be suitable for use as or as part of such a heating element. In embodiments, the target may comprise material selected from the group silicon carbide (SiC), molybdenum disilicide (MoSi$_2$), lanthanum chromite (LaCr$_2$O$_4$), zirconia (ZrO$_2$).

In embodiments, the ceramic target may comprise a thermistor or a material that may be suitable for us as or as part of such a thermistor. In embodiments, the target may comprise material selected from the group consisting of iron spinel material, cobalt spinel material and manganese spinel material.

In embodiments, the ceramic target may comprise a superconductor material, for example yttrium barium copper oxide (YBa$_2$Cu$_3$O$_7$), a bismuth-strontium-calcium-copper oxide material (for example Bi$_2$Sr$_2$CuO$_6$, Bi$_2$Sr$_2$CaCu$_2$O$_8$, or Bi$_2$Sr$_2$Ca$_2$Cu$_3$O$_{10}$), a thallium-barium-calcium-copper oxide material (for example Tl$_2$Ba$_2$CuO$_6$, Tl$_2$Ba$_2$CaCu$_2$O$_8$, Tl$_2$Ba$_2$Ca$_2$Cu$_3$O$_{10}$, or TlBa$_2$Ca$_3$Cu$_4$O$_{11}$) or a mercury-barium-calcium-copper oxide material (for example HgBa$_2$CuO$_4$, HgBa$_2$CaCu$_2$O$_6$, or HgBa$_2$Ca$_2$Cu$_3$O$_8$).

In embodiments, the target may comprise a perovskite material. In embodiments the target may comprise barium titanate (BaTiO$_3$) or barium titanate including non-stoichiometric lead, strontium or calcium substitutions.

In operation pulsed laser radiation of desired characteristics is scanned across the surface of the target 8 by the laser 4 under control of the laser controller 6 to produce a periodic arrangement of structures on the surface. For example, in order to form peaks and troughs arranged in parallel rows, the laser beam may be scanned along parallel, spaced-apart paths across the surface to form parallel troughs separated by peaks. Any other suitable arrangements of structures can be formed by suitable scanning of the laser beam over the surface.

Operating parameters of the laser, and certain equations linking such parameters, can be represented as follows, Wavelength ($\lambda$) [m]

Repetition rate of the laser ($\gamma$) [Hz]

Pulse length of the laser (r) [s]

Average power of the laser ($P_{avg}$) [W]—represents the energy flow over one period t Energy per pulse ($E_p$) [J]

Fluence of the laser (F) [J/cm$^2$]

Beam spot radius on the target (r) [m]

Beam spot area on the target (A=$\pi r^2$)[m$^2$]

Number of times surface of the target was scanned by the laser beam (N) dimensionless Speed at which surface of the target was scanned by the laser beam (V) [m/s]

Number of pulses fired per each spot on the surface of the target (n) [dimensionless]

Time interval between the pulses—one period (t) [s]

Peak Power ($P_{peak}$) [W]—defines the energy flow within a single pulse

Power density or Intensity (I) [W/cm$^2$]

Key Equations $$t = \frac{1}{\gamma}$$

$$n = \frac{(2r)\gamma}{V}$$

$$E_p = \frac{P_{avg}}{\gamma}$$

$$F = \frac{E_{pulse}}{A}$$

$$P_{peak} = \frac{E_{pulse}}{\tau}$$

$$I = \frac{P_{peak}}{A}$$

Suitable operating parameters can be selected, for example based on the equations and representations above, to obtain pulsed laser radiation of desired properties, for example a desired power density of the pulses.

Table 1 provides operating parameters of the laser of the apparatus of FIG. 1 to produce a desired periodic arrangement of structures on the surface of various samples of alumina. The laser processing of the surface was performed in an argon atmosphere for the PSCA sample and in air for all of the other samples of Table 1.

TABLE 1

| | Sample name | | | | | | |
|---|---|---|---|---|---|---|---|
| | PSCA | PS2L1R | PS2C1R | PS2L2R | PS2C2R | PS4L1R | PS1C1R |
| Wavelength (nm) | 532 | 532 | 532 | 532 | 532 | 532 | 532 |
| τ | 10 ps | 10 ps | 10 ps | 10 ps | 10 ps | 10 ps | 10 ps |
| Repetition rate (kHz) | 200 | 200 | 200 | 200 | 200 | 200 | 200 |
| Power (W) | 2 | 2 | 2 | 2 | 2 | 4 | 1 |
| Laser focal spot diameter (μm) | 12 | 12 | 12 | 12 | 12 | 12 | 12 |
| Pulse energy (μJ) | 10.00 | 10.00 | 10.00 | 10.00 | 10.00 | 20.00 | 5.00 |
| Fluence (J/cm$^2$) | 8.84 | 8.84 | 8.84 | 8.84 | 8.84 | 17.68 | 4.42 |
| Structure (cross/line) | Cross | lines | cross | lines | cross | lines | cross |
| Hatch distance (μm) | 24 | 24 | 24 | 24 | 24 | 24 | 24 |
| Scan speed (mm/s) | 6 | 6 | 6 | 6 | 6 | 6 | 6 |
| Passes | 1 | 1 | 1 | 2 | 2 | 1 | 1 |
| Pulses per spot per pass | 400 | 400 | 400 | 400 | 400 | 400 | 400 |
| Width of laser-processed area (mm) | 14 | 15.2 | 15.2 | 15.2 | 15.2 | 15.2 | 15.2 |
| Length of laser-processed area (mm) | 14 | 15.2 | 15.2 | 15.2 | 15.2 | 15.2 | 15.2 |
| Process time (minutes) | 45.37 | 26.74 | 53.48 | 53.48 | 106.96 | 26.74 | 53.48 |

The samples of Table 1 had a thickness of 3 mm, and the laser processed areas of the samples were 14 mm by 14 mm (for sample PSCA) or 15.2 mm by 15.2 mm (for the other samples). Each of the samples were aluminium oxide (alumina) of greater than 99.7% purity, which is the grade used for certain particle accelerator applications.

The secondary electron yield (SEY) of each of the samples of Table 1 was measured for different primary electron energies at either three or four different spots on the samples. To avoid charging effects the surfaces were bombarded with low energy electrons (36 eV) between each measurement point. The maximum applied dose to measure one data point was about $1 \times 10^{-12}$ C. The total dose to measure one spectrum was therefore about $1 \times 10^{-11}$ C.

Figure 2:
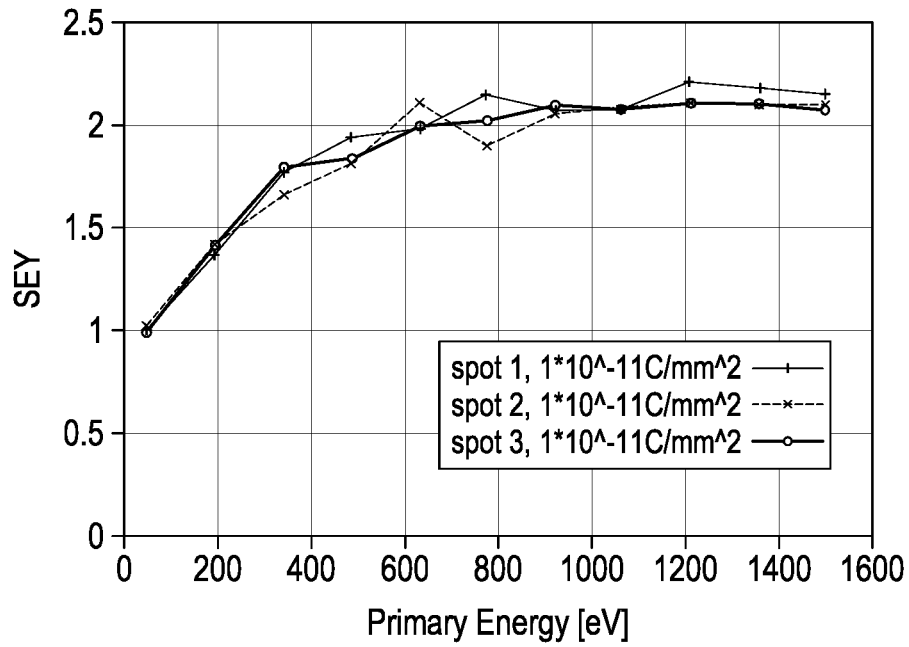
FIG. 2 is a plot of SEY as a function of primary electron energy for a sample according to an embodiment.
Figure 3:
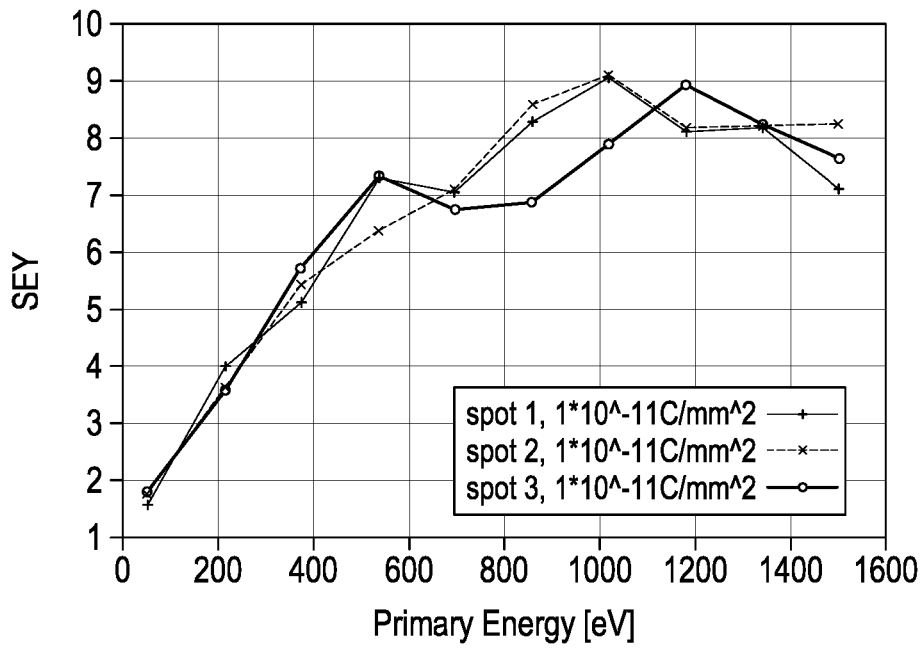
FIG. 3 is a plot of SEY as a function of primary electron energy for the reverse side of the sample of FIG. 2.
Figure 4:
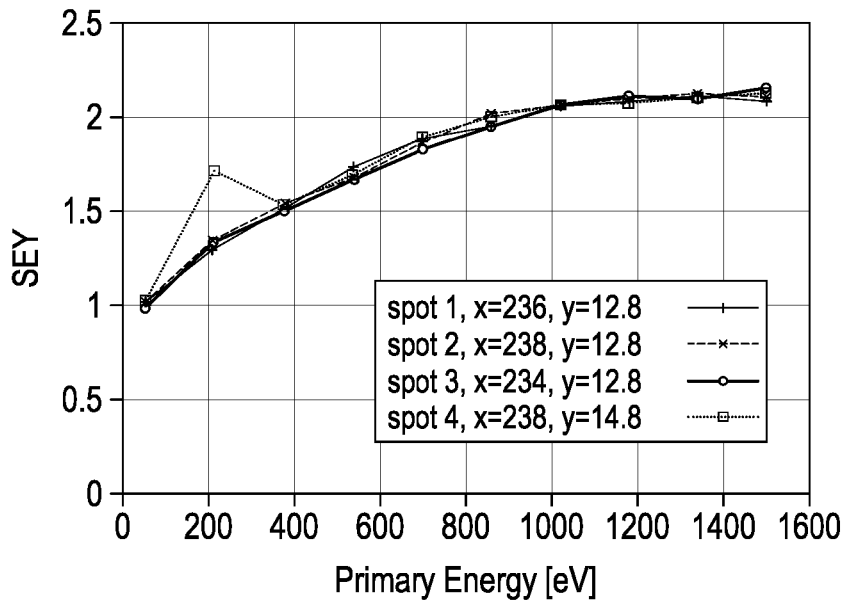
FIGS. 4 to 9 are plot of SEY as a function of primary electron energy for samples according to further embodiments.
Figure 5:
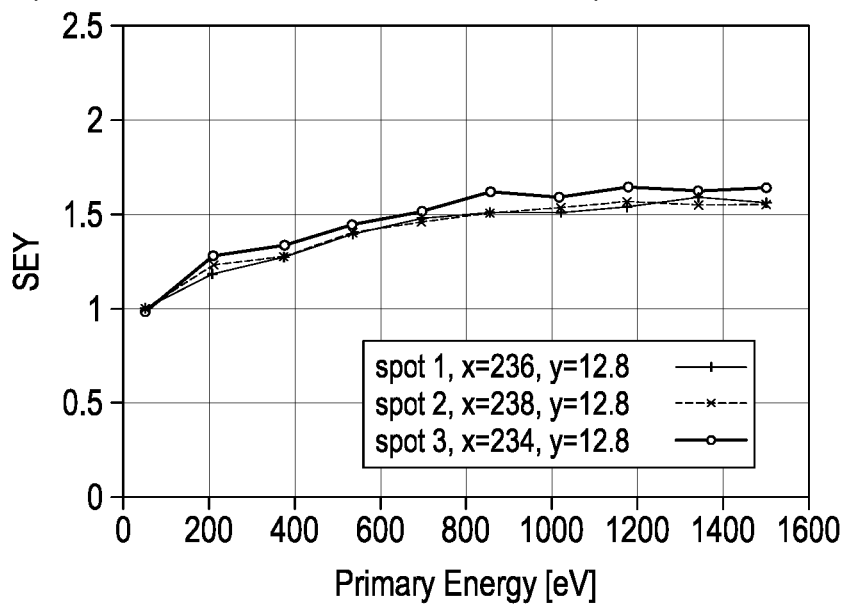
Figure 6:
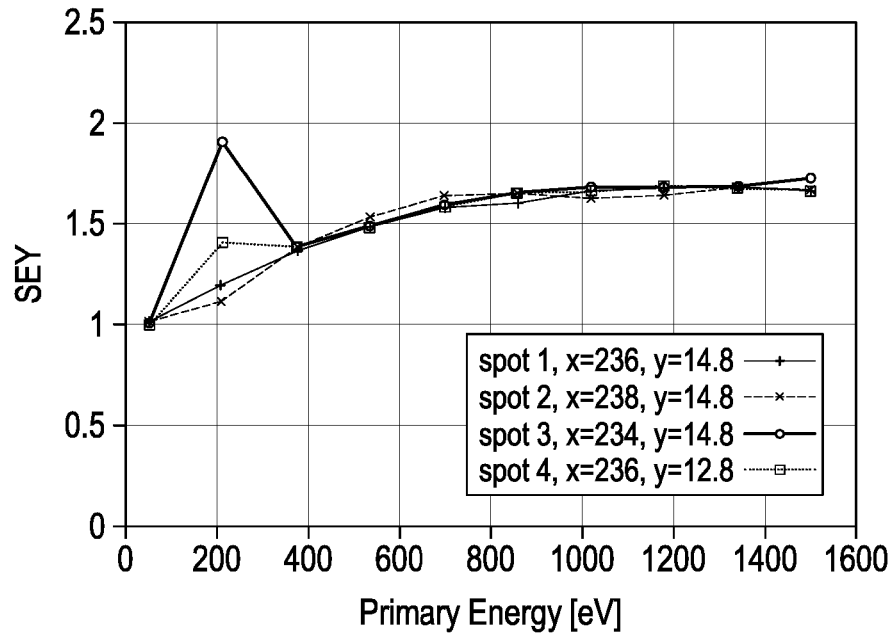
Figure 7:
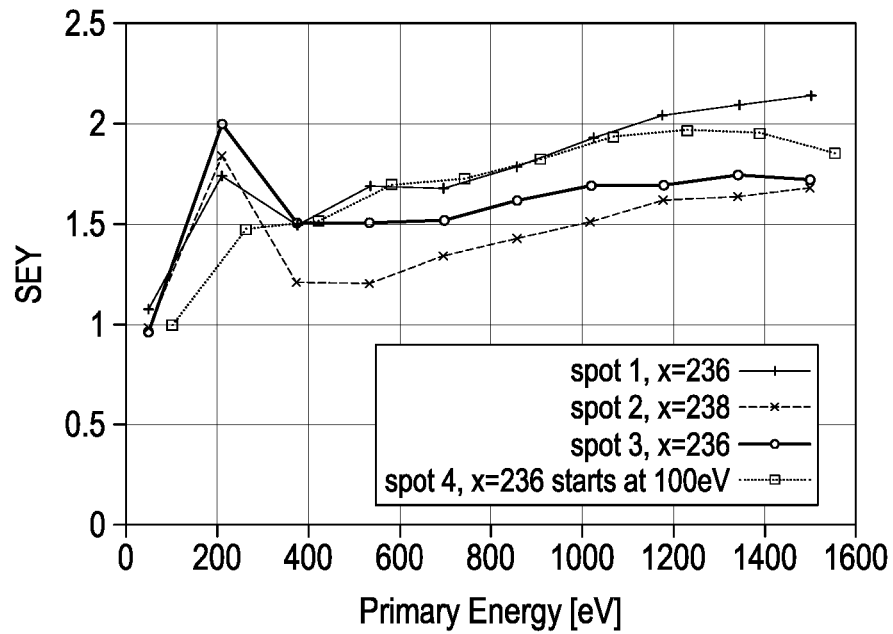
Figure 8:
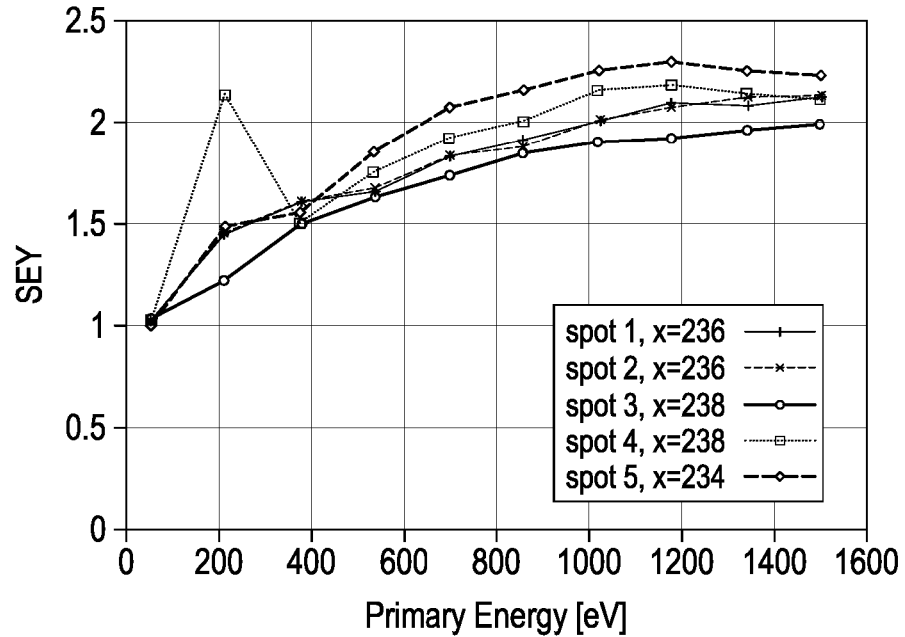
Figure 9:
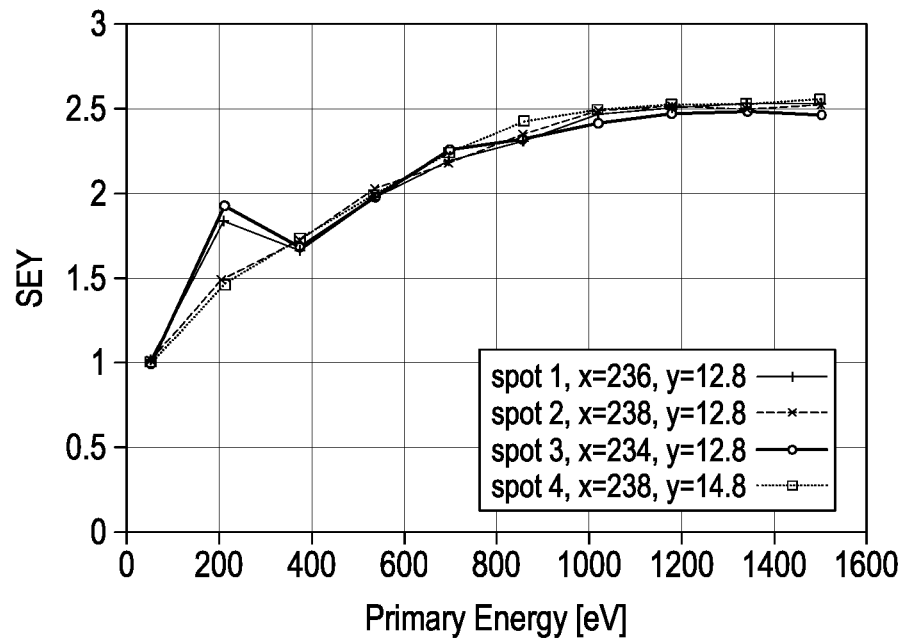

FIG. 2 is a plot of SEY as a function of primary electron energy for sample PSCA at three different spots on the laser treated surface. FIG. 3 is a plot of SEY as a function of primary electron energy for sample PSCA at three different spots on the reverse side of the sample which was not laser treated, for comparison purposes.

It can be seen that the laser treatment of the surface of the PSCA sample resulted in a reduction of SEY from around 8 to 9 (for the untreated reverse surface) to around 2.2 for the laser treated surface.

FIGS. 4 to 9 are plot of SEY as a function of primary electron energy for samples PS1C1R, PS2C1R, PS2C2R, PS2L1R, PS2L2R and PS4L1R respectively.

The approximate maximum SEY values for the various samples of Table 1 are summarised in Table 2 below.

TABLE 2

| Sample | Maximum SEY value obtained for laser-treated surface |
|---|---|
| PSCA | 2.2 |
| PS1C1R | 2.2 |
| PS2C1R | 1.6 |

TABLE 2-continued

| Sample | Maximum SEY value obtained for laser-treated surface |
|---|---|
| PS2C2R | 1.7 (outlier 1.9) |
| PS2L1R | 1.9 |
| PS2L2R | 2.2 |
| PS4L1R | 2.5 |

Scanning electron microscope (SEM) images of the samples of Table 1 were obtained, and show structures formed by the laser treatment of the surfaces of the samples.

Figure 10A:
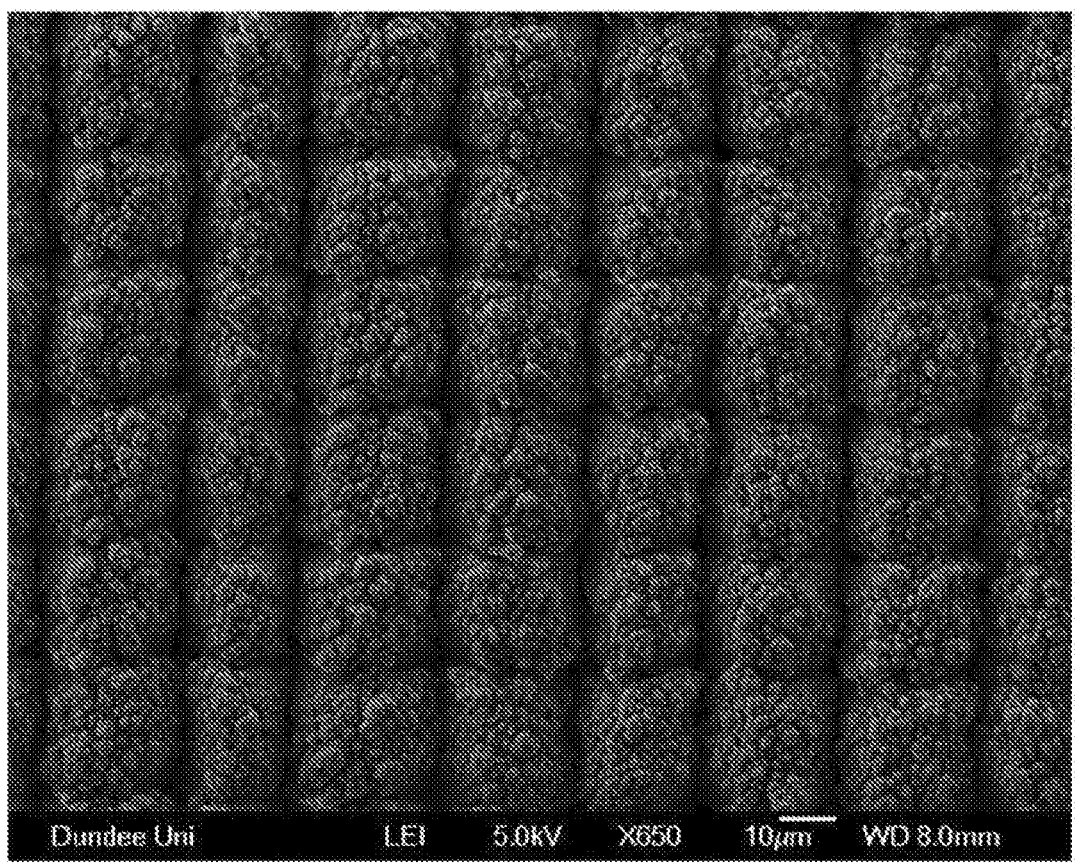
FIGS. 10a to 10c are scanning electron microscope (SEM) images of surfaces of samples according to embodiments.
Figure 10B:
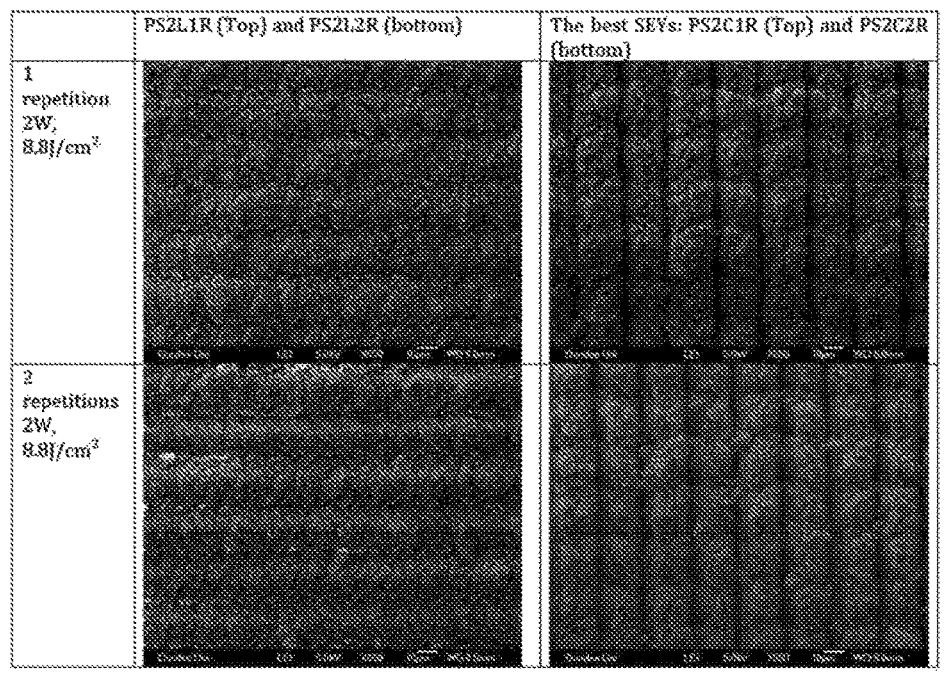

FIG. 10a is an SEM image of the laser treated surface of sample PSCA.

10b shows SEM images of the laser treated surfaces of the PS2L1R sample (top left image), the PS2L2R sample (bottom left image), the PS2C1R sample (top right image) and the PS2C2R sample (bottom right image).

Figure 10C:
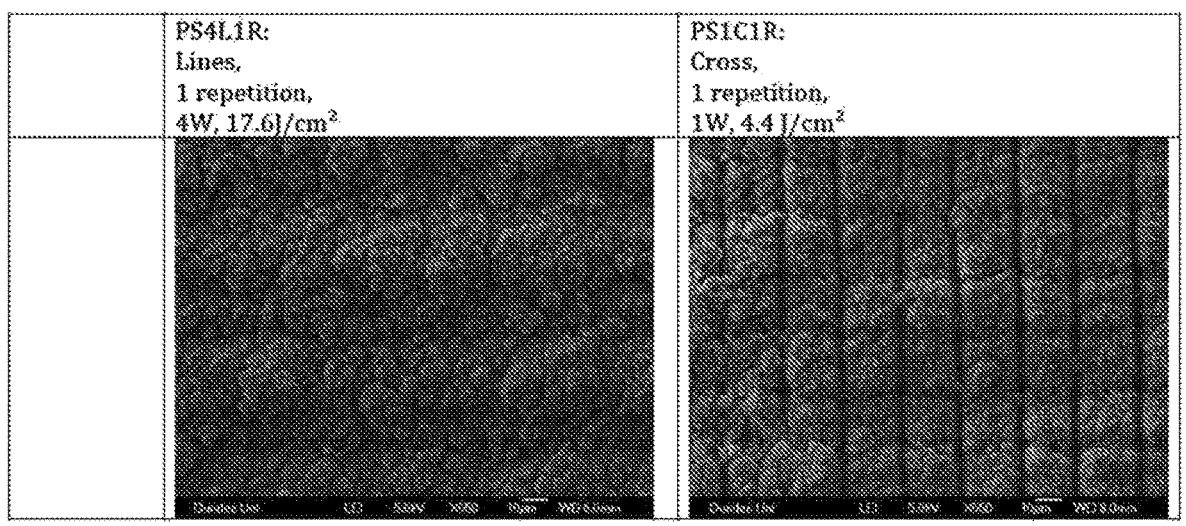
Figure 11A:
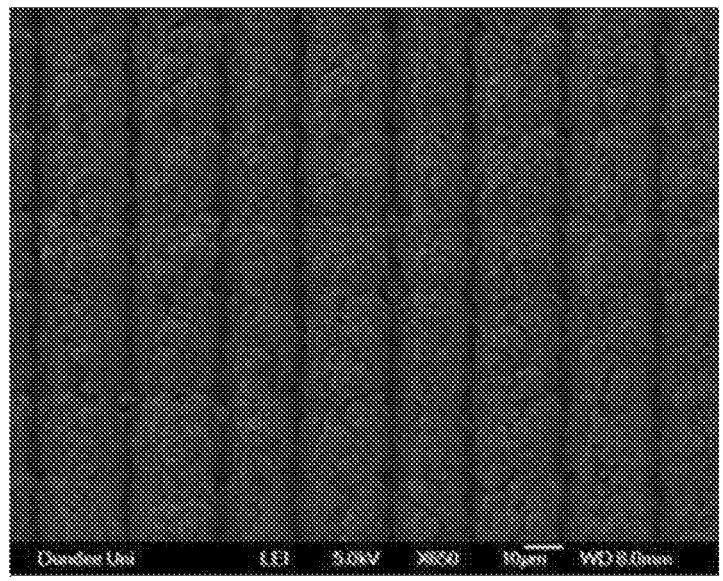
FIGS. 11a to 11j are SEM images of surfaces of samples according to further embodiments.
Figure 11B:
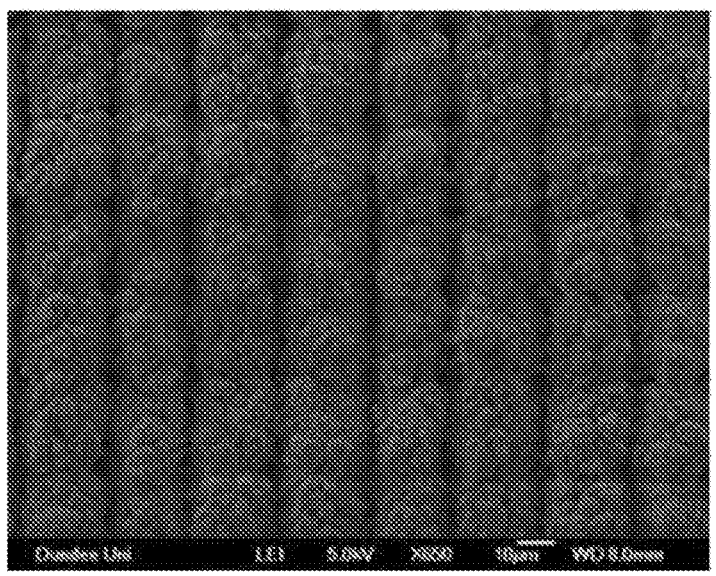
Figure 11C:
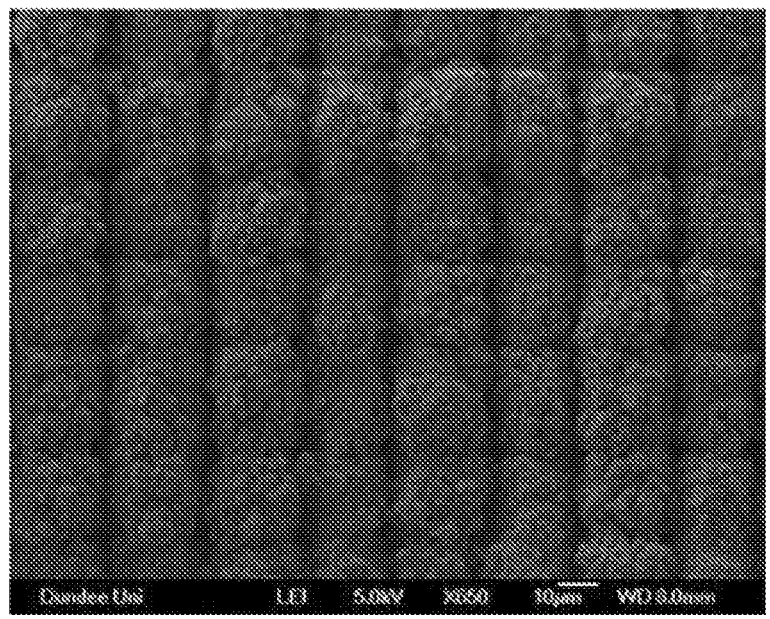
Figure 11D:
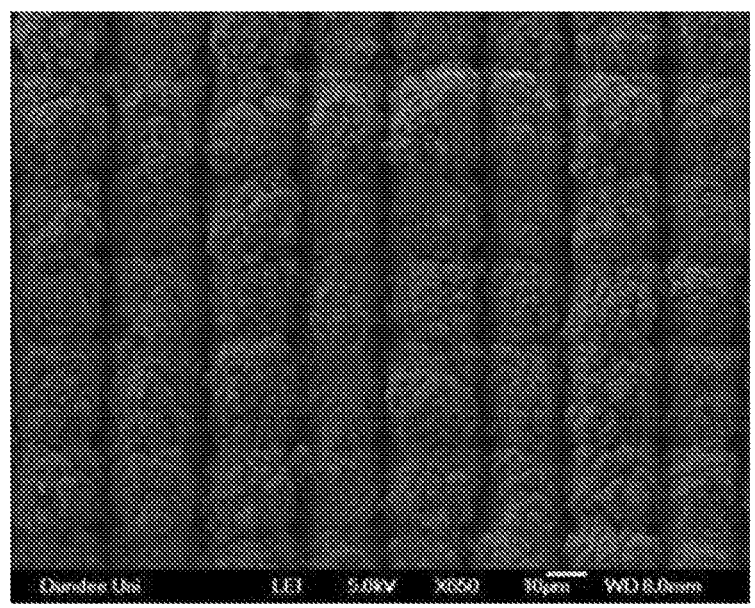
Figure 11E:
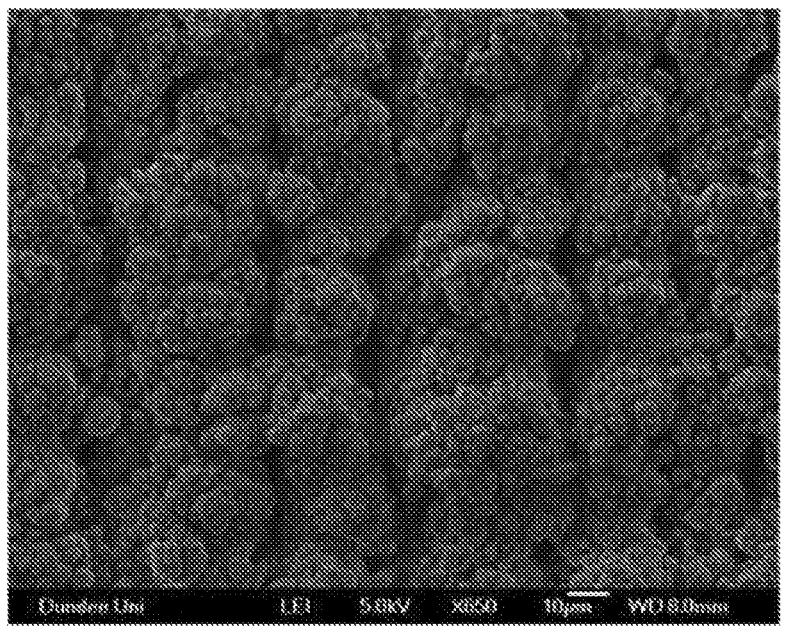
Figure 11F:
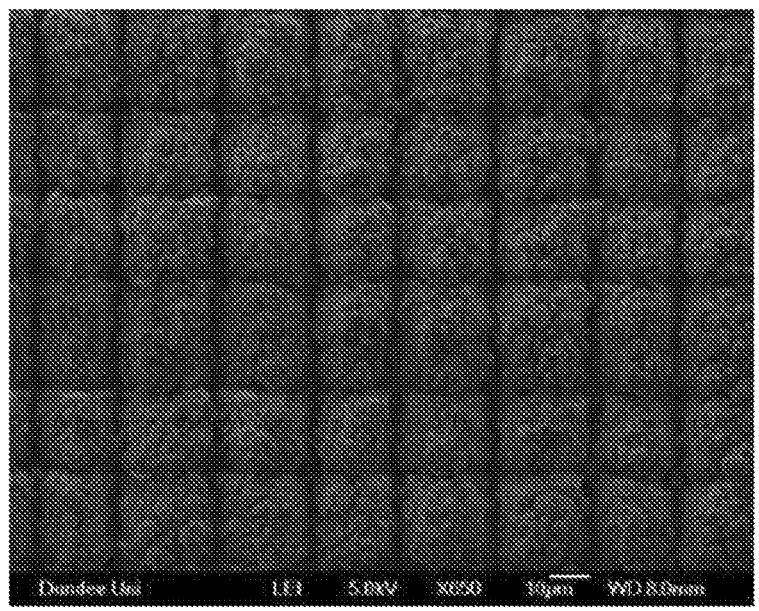
Figure 11G:
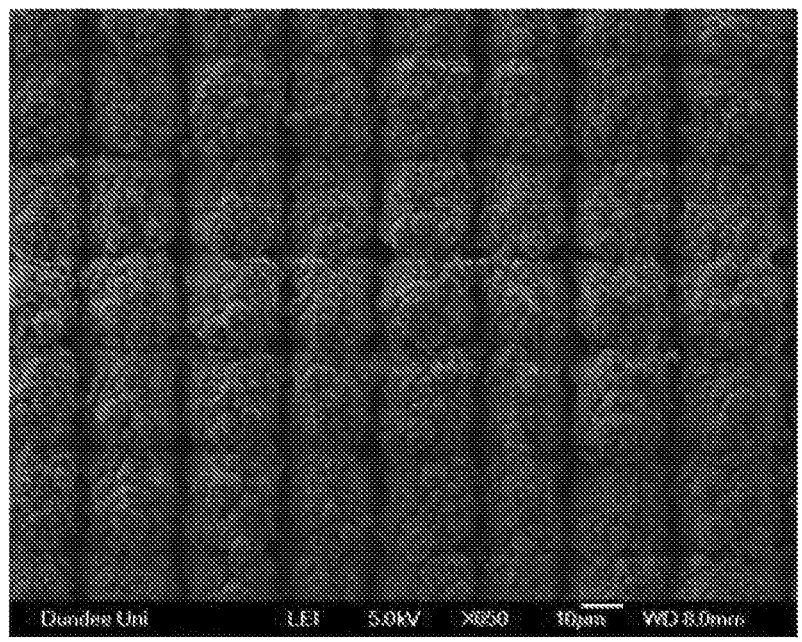
Figure 11H:
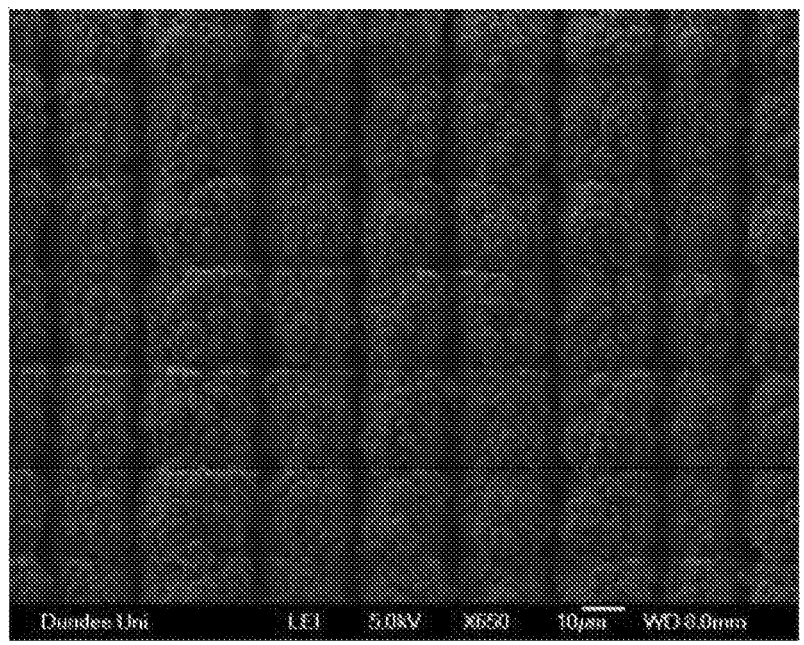
Figure 11I:
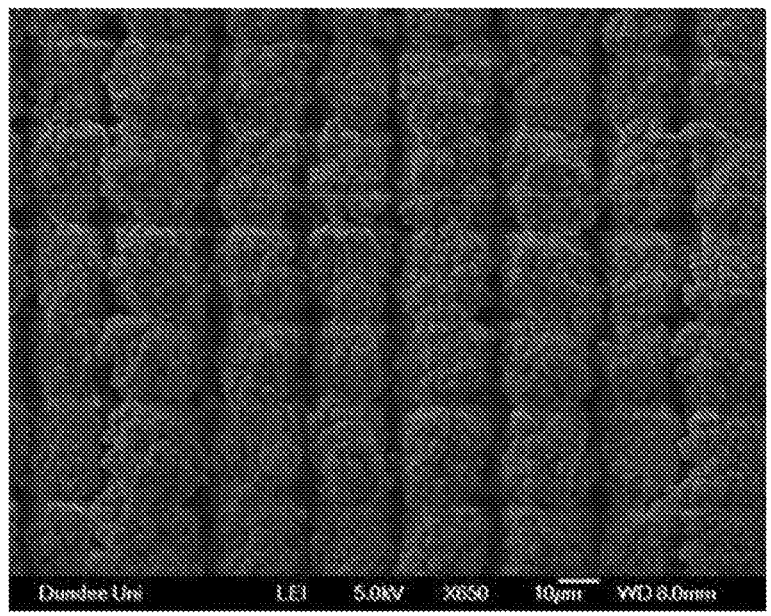
Figure 11J:
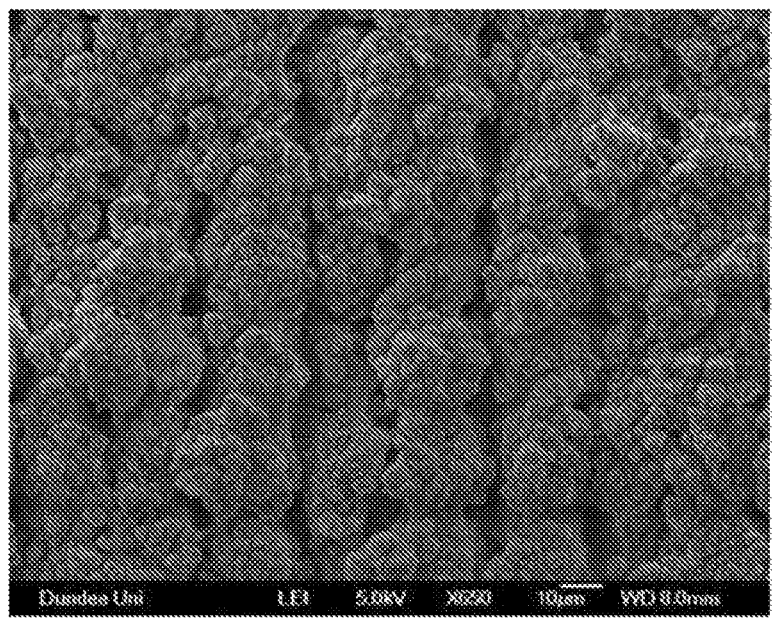

FIG. 10c shows SEM images of the laser treated surfaces of the PS4L1R sample (left hand image) and the PS1C1R sample (right hand image).

FIGS. 11a to 11e are SEM images of laser treated surfaces for which the power density of the laser beam was 0.74 TW/cm$^2$, 0.88 TW/cm$^2$, 0.95 TW/cm$^2$, 2 TW/cm$^2$, 1.3 TW/cm$^2$ respectively and the sample was laser treated in an argon atmosphere. FIGS. 11f to 11j are SEM images of laser treated surfaces for which the power density of the laser beam was 0.3 TW/cm$^2$, 0.4 TW/cm$^2$, 2 TW/cm$^2$, 0.6 TW/cm$^2$ and 1 TW/cm$^2$ respectively and the sample was laser treated in air. Other operating parameters were substantially the same as for sample PSCA of Table 1.

It is noted that in a normal, unmagnified view of sample PSCA (which was processed under argon atmosphere) the surface appeared black, whilst in normal unmagnified views of the other samples of Table 1 the surfaces of the samples appeared white, or at least much lighter than the surface of sample PSCA.

Figure 12:
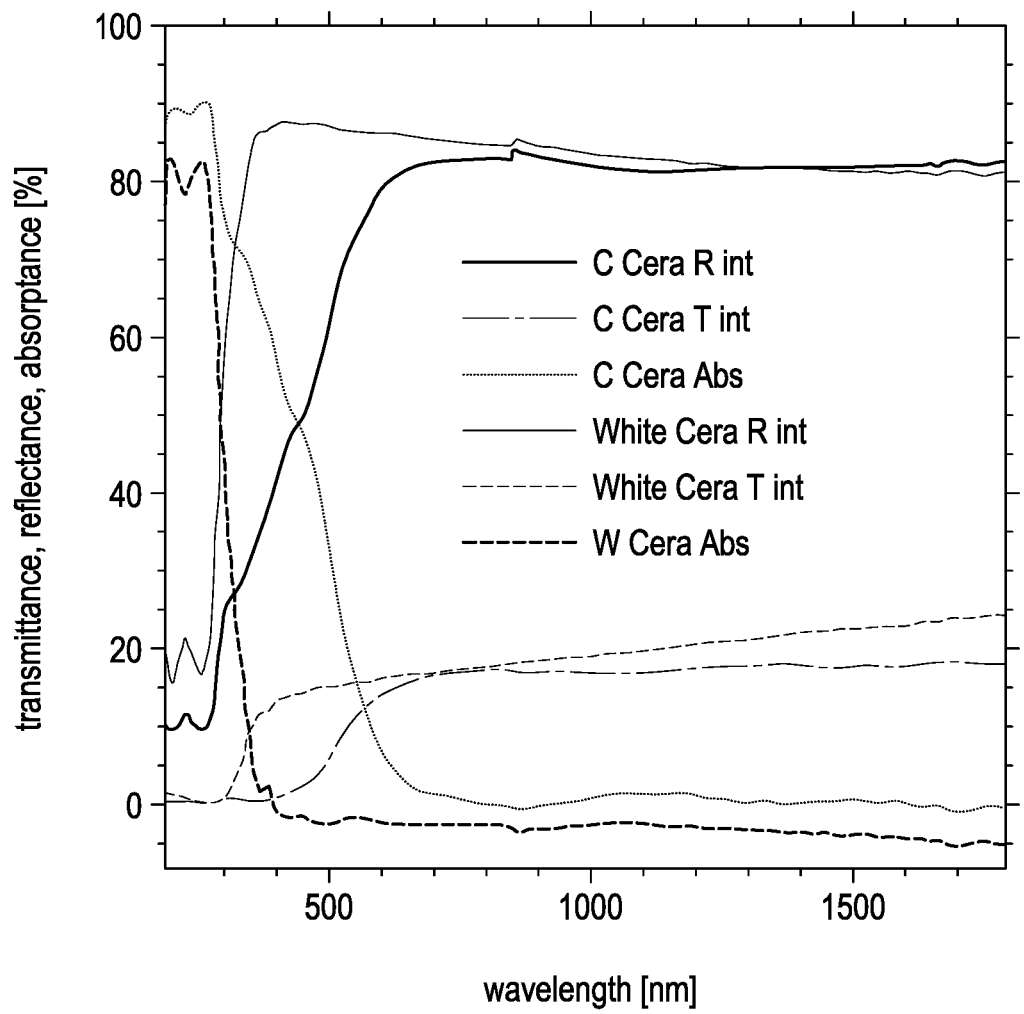
FIG. 12 is a graph showing total reflectance, total transmittance and absorptance for samples.

Measurements of the spectral properties of samples of aluminium oxide were also performed. FIG. 12 is a graph showing total reflectance, total transmittance and absorptance of a sample of aluminium oxide (referred to as C Cera, having a purity of around 99.7%) used by CERN in a kicker magnet and of another sample of aluminium oxide (referred to as White Cera) before any laser processing. The spectra show some absorptance at 532 nm and very low absorptance at 1064 nm. Reflectance is different for the samples, which is in accordance with the different colours of the samples that are apparent to the human eye. The thickness of both samples was 3 mm. It was determined from these measurements that laser processing at 532 nm, or 515 nm—another available laser wavelength, may be suitable.

It can be seen from the results outlined above that the maximum SEY value measured for the laser treated surfaces of the samples of Table 1 varies between 1.6 and 2.2. The sample with the lowest SEY is PS2C1R with a maximum value of 1.6. There seems to be substantially no link between reflectivity and the SEY of the samples. Some samples have outliers at 200 eV electron energy, which could be due to inhomogeneities at the surface.

In some other embodiments where the sample is alumina, operating parameters may be selected from Table 3 as follows to produce a desired periodic arrangement of structures on the surface of the sample. The values of the operating parameters may also be selected from Table 3 in the case of other ceramic materials of interest.

Good results may be achieved with a power density range of 0.1 TW/cm$^2$ to 3 TW/cm$^2$, with particularly good results for wavelength of 532 nm in the power density range 0.5 TW/cm$^2$ to 1.5 TW/cm$^2$ for processing in argon. However, highly organised structuring is achieved for laser processing in either air or argon.

The results discussed above in relation to Tables 1 to 3 and FIGS. 2 to 12 were obtained using laser beam power densities in the TW/cm$^2$ range. In alternative embodiments, laser patterning of ceramic surfaces is obtained using laser beam power densities in the GW/cm$^2$ range.

Table 4 provides operating parameters of the laser of the apparatus of FIG. 1 to produce a desired periodic arrangement of structures on the surface of a sample (referred to as the NSCA sample) of alumina, using laser beam power densities in the GW/cm$^2$ range. The laser processing of the surface was performed in an argon atmosphere for the NSCA sample.

TABLE 4

| Sample name | NSCA |
|---|---|
| Wavelength (nm) | 532 |
| T | 10 ns |
| Repetition rate (kHz) | 20 |
| Power (W) | 3.46 |
| Laser focal spot diameter (μm) | 60 |
| Pulse energy (μJ) | 173.0 |
| Fluence (J/cm$^2$) | 6.12 |
| Structure (cross/line) | cross |
| Hatch distance (μm) | 70 |
| Scan speed (mm/s) | 20 |
| Passes | 10 |
| Pulses per spot per pass | 60 |
| Width of laser-processed area (mm) | 14 |
| Length of laser-processed area (mm) | 14 |
| Process time (minutes) | 46.67 |

Table 4 is in the same format as Table 1 above, which provided operating parameters for certain samples treated with laser power densities in the TW/cm$^2$ range.

The NSCA sample of Table 1 had a thickness of 3 mm, and the laser processed area of the samples was 14 mm by 14 mm. The sample was aluminium oxide (alumina) of greater than 99.7% purity, which is the grade used for certain particle accelerator applications.

The secondary electron yield (SEY) of the NSCA sample of Table 4 was measured for different primary electron

TABLE 3

| Wavelength (nm) | Pulse width range | Focal spot diameter | Repetition rate (KHz) | Average power (W) | Scan speed (mm/s) | Repetition number | Hatch distance (mcm) | Power density (intensity) |
|---|---|---|---|---|---|---|---|---|
| 355 nm, 532 nm or 1064 nm | 500fs-1 ns | 1 μm-100 μm | 10 kHz-200 kHz | 1-10 | 1-100 | 1-10 | 10-100 | 0.1 TW/cm$^2$ to 3 TW/cm$^2$ | energies at three different spots on the sample. To avoid charging effects the surfaces were bombarded with low energy electrons (36 eV) between each measurement point. The maximum applied dose to measure one data point was about $1\times10^{-12}$ C. The total dose to measure one spectrum was therefore about $1\times10^{-11}$ C.

Figure 13:
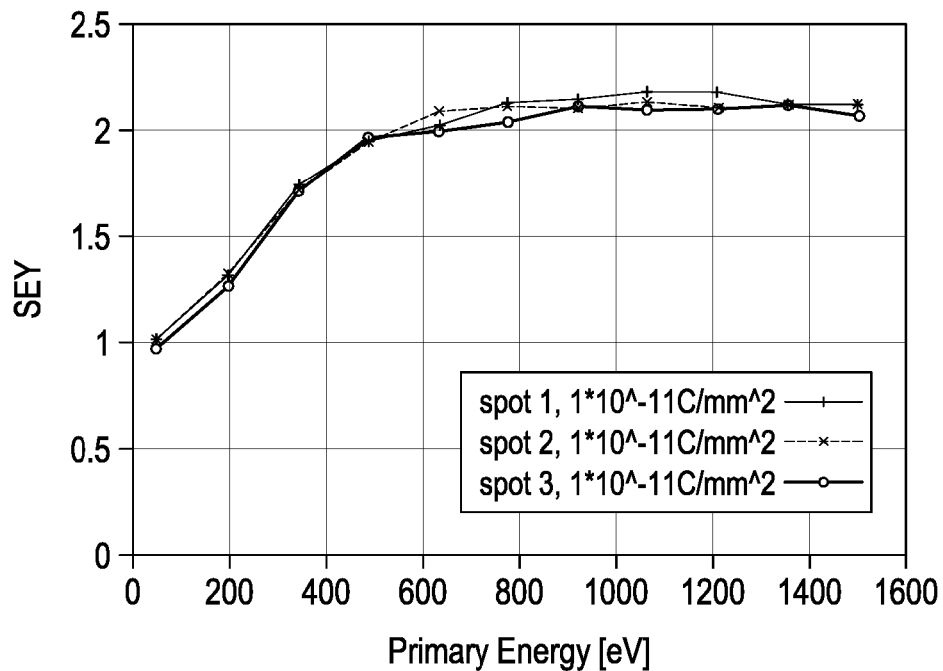
FIG. 13 is a plot of SEY as a function of primary electron energy for a sample according to a further embodiment.

FIG. 13 is a plot of SEY as a function of primary electron energy for sample NSCA at three different spots on the laser treated surface.

After the performance of the SEY measurements, the NSCA sample was conditioned in an attempt to obtain even lower SEY values by bombarding the sample with 500 eV electrons up to a total dose of $1\times10^{-2}$ C/mm$^2$ and then exposing the sample to air during one night.

Figure 14:
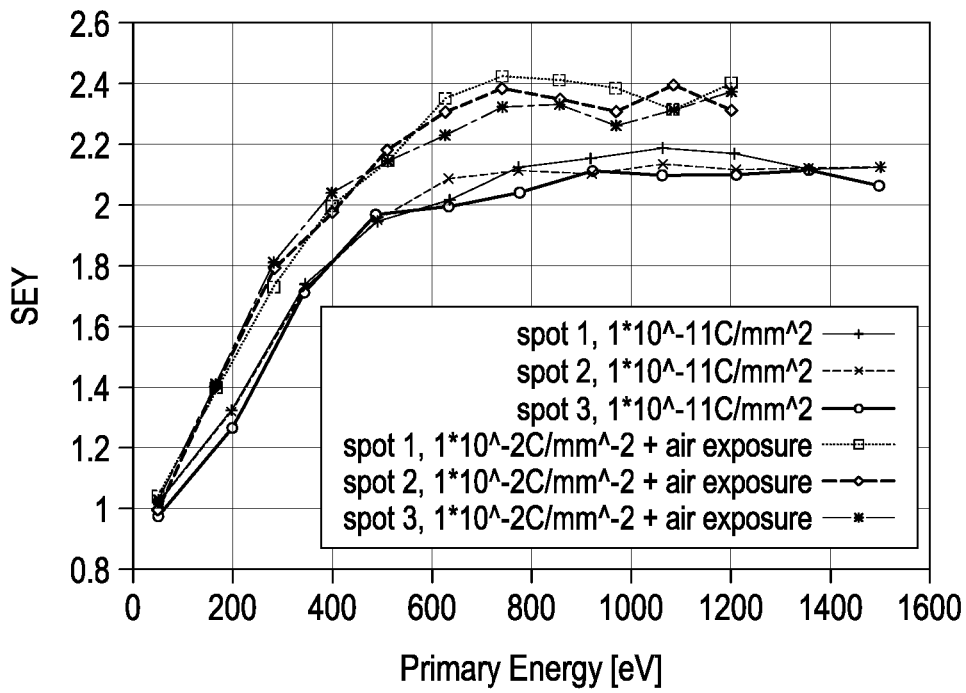
FIG. 14 is a plot of SEY as a function of primary electron energy for the sample of FIG. 13, including data after conditioning and exposure to air of the sample.

FIG. 14 is a plot of SEY as a function of primary electron energy for sample NSCA at three different spots on the laser treated surface following the conditioning using 500 eV electrons and exposure to air. The SEY results of FIG. 13 are also included on FIG. 14 for comparison.

It was found that the SEY results of FIG. 14 obtained after the conditioning and air exposure showed an increased maximum SEY, suggesting a reactive surface. The measurements of SEY spectra after the conditioning and air exposure were not well reproducible, for which a possible reason may be implantation of charges into the bulk of the ceramic.

To verify the charging of the NSCA sample surface, X-ray photoelectron spectroscopy measurements to obtain an XPS spectrum were performed following the conditioning and air exposure. The XPS spectrum indicated that aluminium (15 atomic %) and oxygen (79 atomic %) were the main elements present, that carbon contamination was low (1 atomic %) and that some fluorine was present (5 atomic %).

Figure 15A:
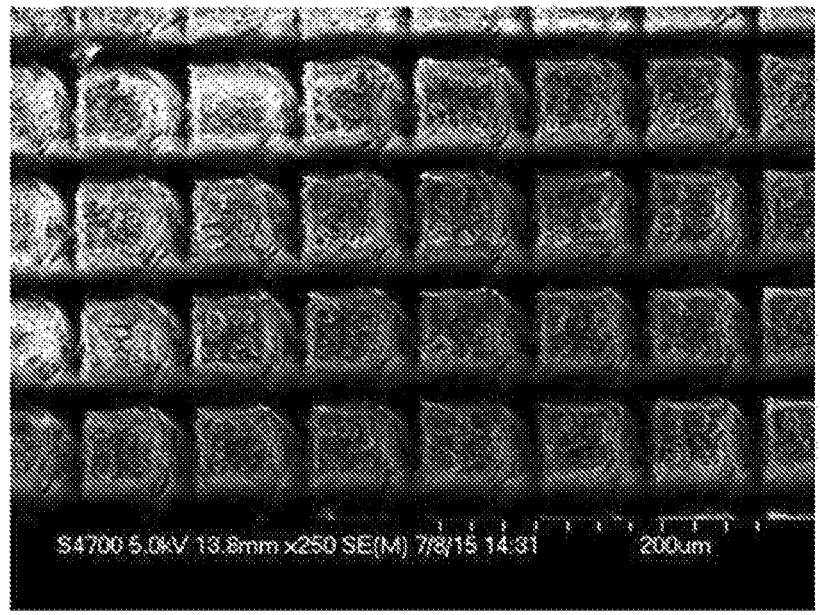
FIGS. 15a and 15b are SEM images of surfaces of samples according to embodiments.
Figure 15B:
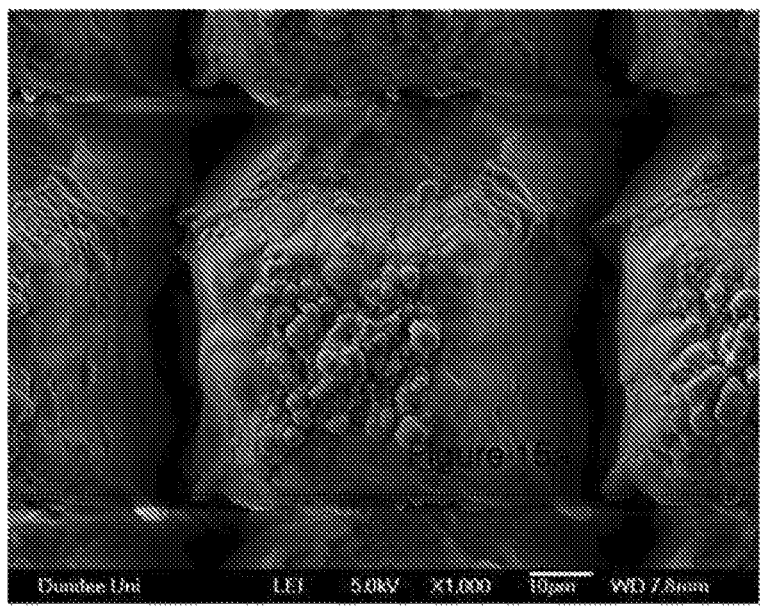
Figure 16A:
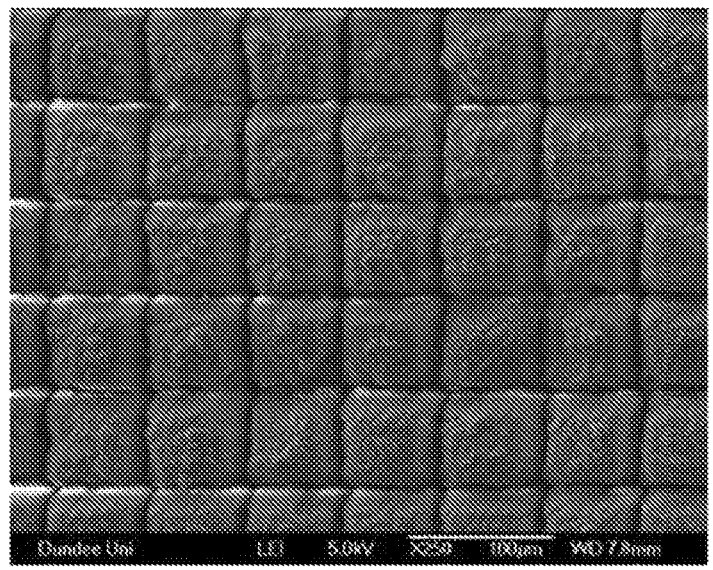
FIGS. 16a to 16n are SEM images of surfaces of samples according to further embodiments.
Figure 16B:
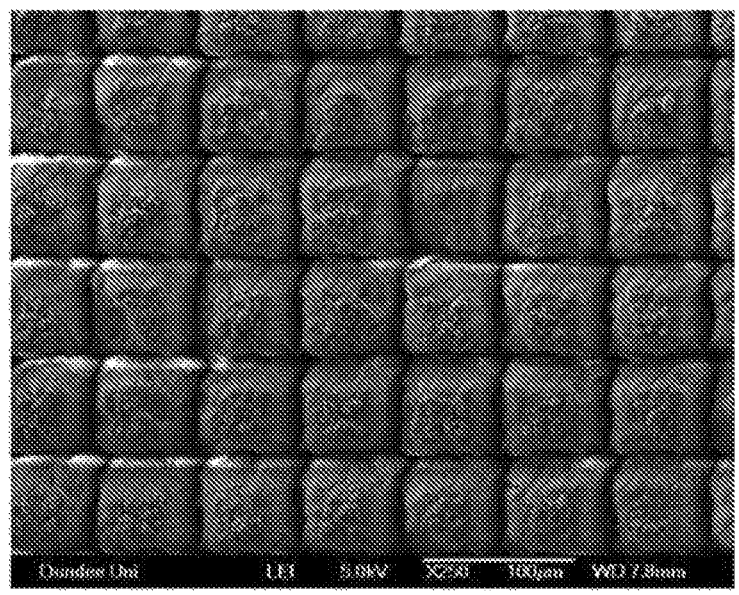
Figure 16C:
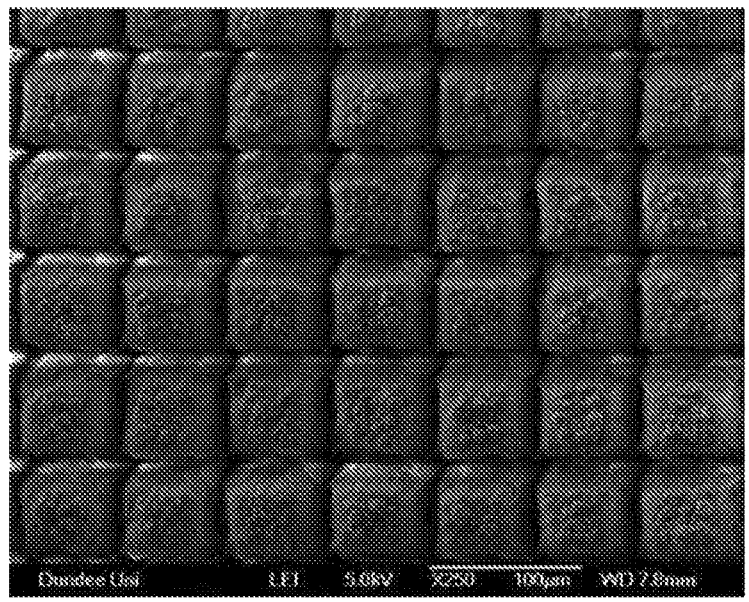
Figure 16D:
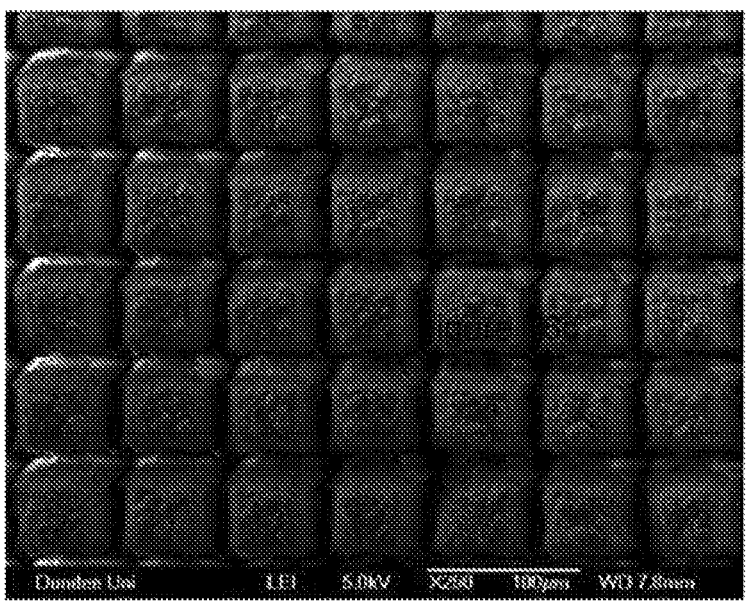
Figure 16E:
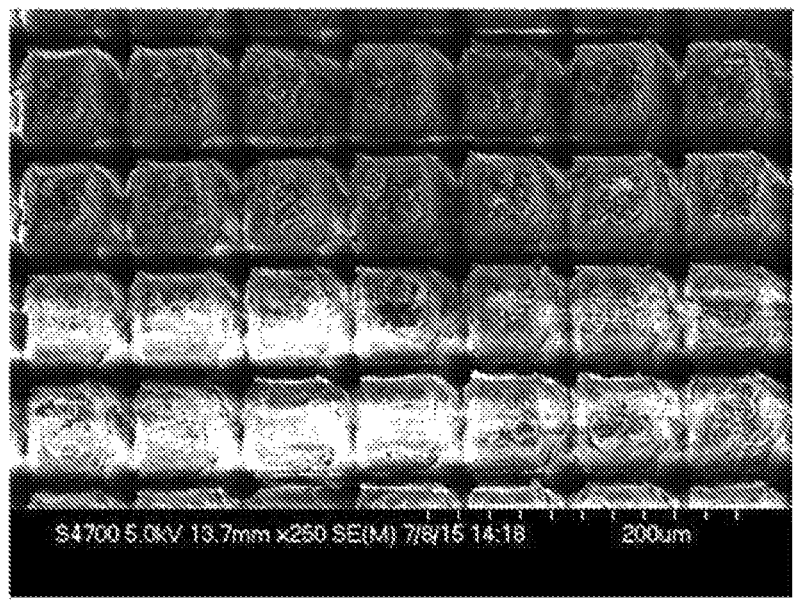
Figure 16F:
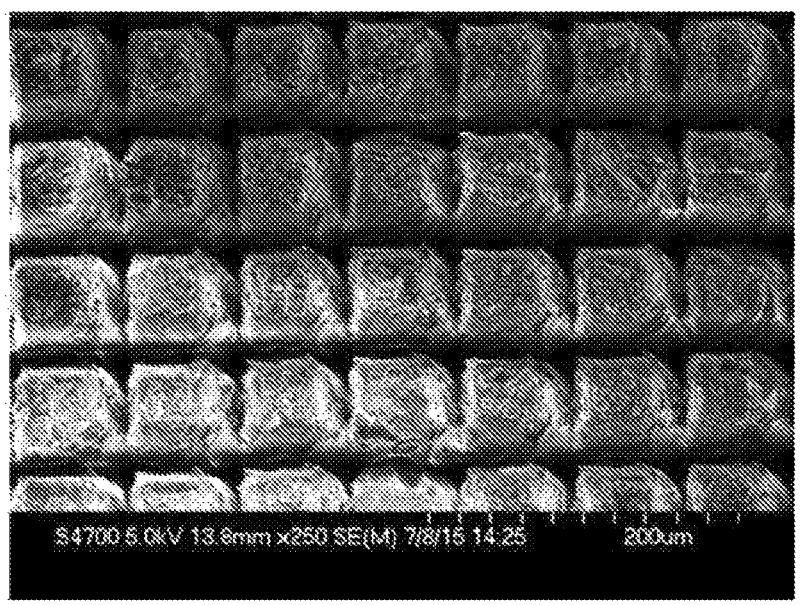
Figure 16G:
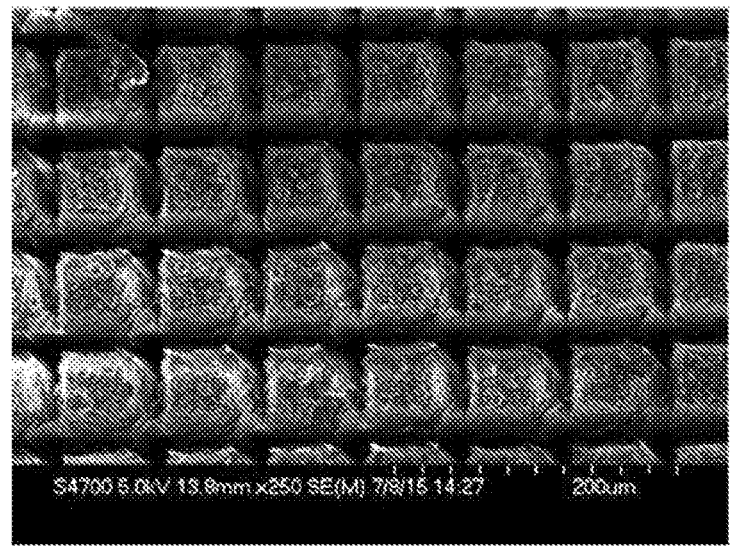
Figure 16H:
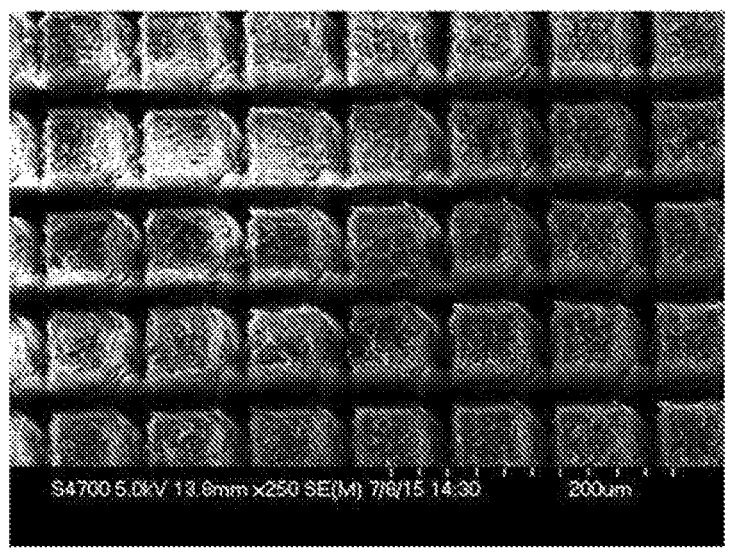
Figure 16I:
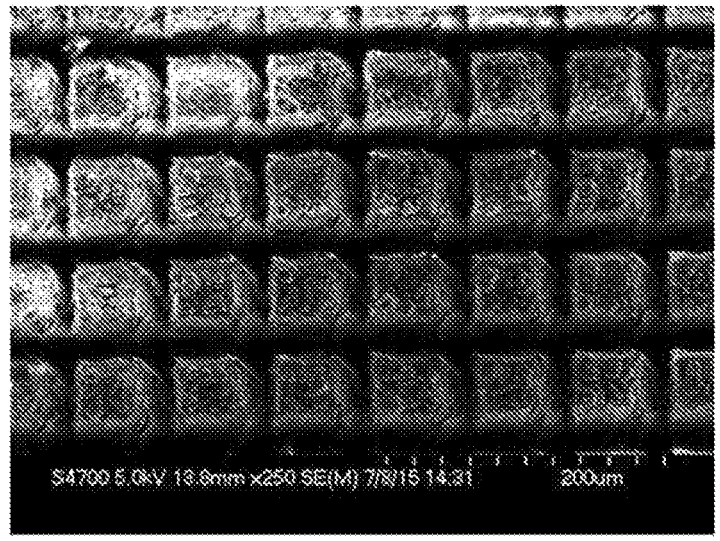
Figure 16J:
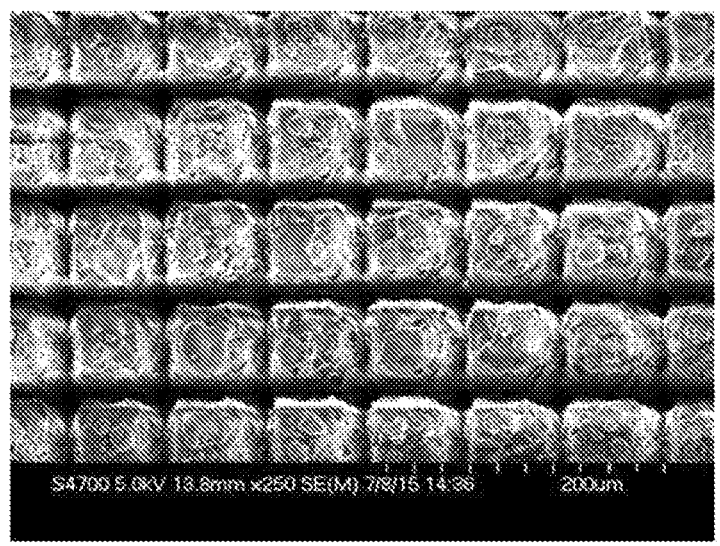
Figure 16K:
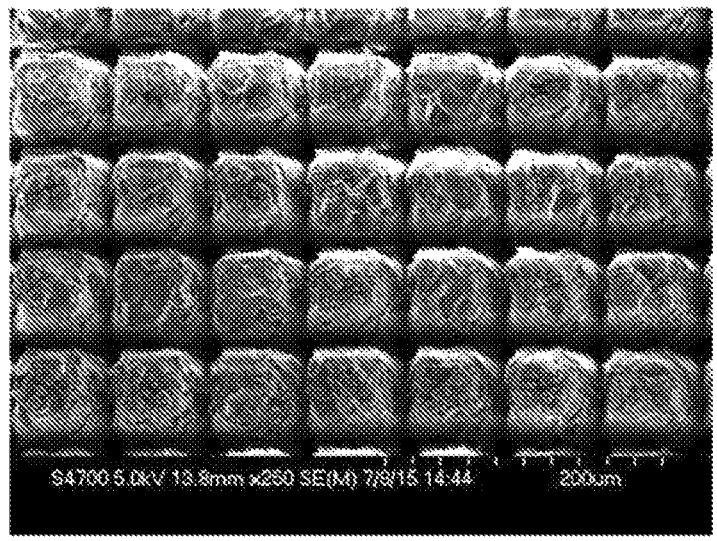
Figure 16L:
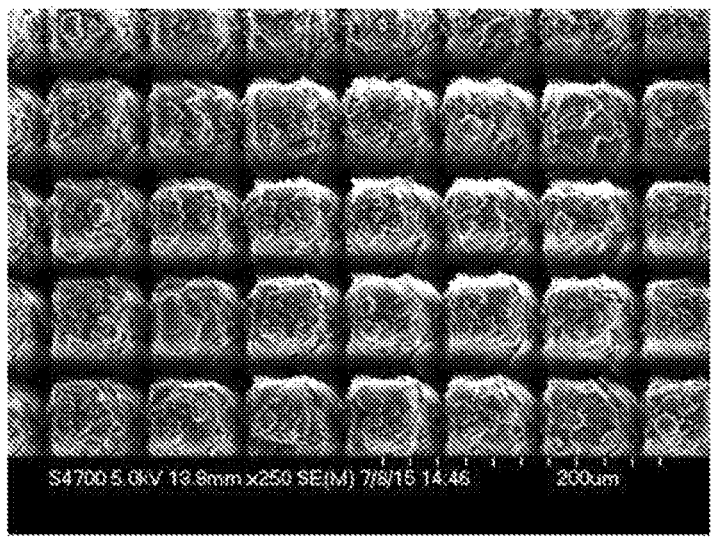
Figure 16M:
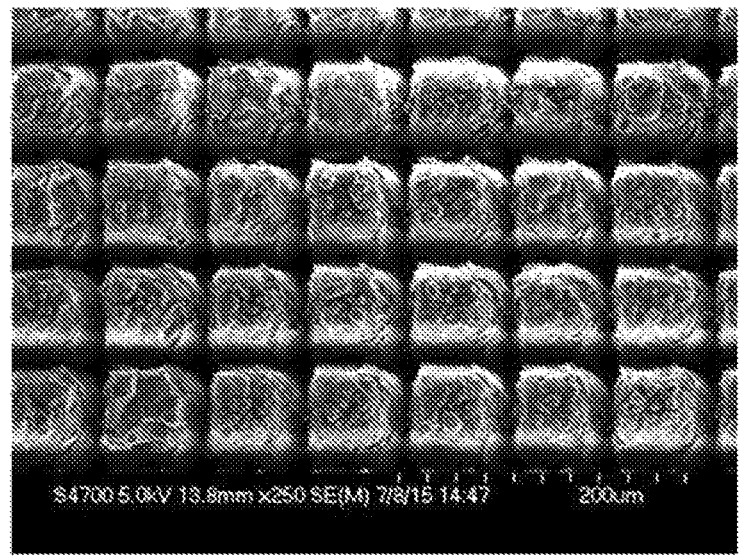
Figure 16N:
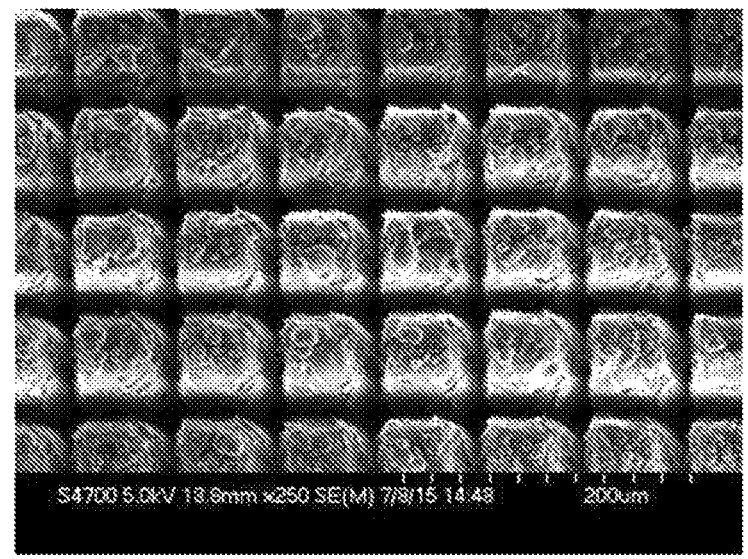

FIGS. 15a and 15b are SEM images, at different levels of magnification, of the laser treated surface of sample NSCA.

FIGS. 16a to 16d are SEM images of laser treated surfaces for which the power density of the laser beam was 0.25 GW/cm$^2$, 0.35 GW/cm$^2$, 0.45 GW/cm$^2$, and 0.55 GW/cm$^2$ respectively and the sample was laser treated in air. FIGS. 16e to 16n are SEM images of laser treated surfaces for which the power density of the laser beam was 0.6 GW/cm$^2$, 0.65 GW/cm$^2$, 0.7 GW/cm$^2$, 0.75 GW/cm$^2$, 0.8 GW/cm$^2$, 0.85 GW/cm$^2$, 0.9 GW/cm$^2$, 0.95 GW/cm$^2$, 1 GW/cm$^2$ and 1.5 GW/cm$^2$ respectively and the sample was laser treated in an argon atmosphere. Other operating parameters were substantially the same as for sample NSCA of Table 4.

In some other embodiments where the sample is alumina, operating parameters may be selected from Table 5 as follows to produce a desired periodic arrangement of structures on the surface of the sample. The values of the operating parameters may also be selected from Table 5 in the case of other ceramic materials of interest.

It is a feature of embodiments that periodic structures can be formed on ceramic surfaces by applying to the surfaces laser radiation having a power density in the TW/cm$^2$ range or in the GW/cm$^2$ range. Without wishing to be bound by theory, and without limitation to the scope of protection, the following comments are provided which relate to processes which may occur in relation to at least some embodiments.

Laser engineering provides an overarching methodology that provides for the formation of periodic structures according to embodiments. Precision laser engineering is expected to excite free electrons within metals, vibrations within insulators, and indeed both types of excitations within semiconductors. The mechanisms by which lasers can engineer materials include the following:

(i) Photo-thermal interaction (PTI)—commonly achieved using laser beams providing short dwell time (e.g. lasers with nanosecond pulsewidth);

(ii) Photo-ablation interaction (PAI)—envisaged using laser beams providing ultra-short dwell time (e.g. lasers with picosecond or femtosecond pulsewidth).

The laser processing in respect of the embodiments described in relation to Tables 4 and 5 and FIGS. 13 to 16 may be in the PTI regime. The laser processing in respect of the embodiments described in relation to Tables 1 to 3 and FIGS. 2 to 11 may be in the PAI regime.

In the PTI regime the focused laser beam acts as a spatially confined, intense heat source. Targeted material is heated up rapidly, eventually causing it to be vaporized. Without wishing to imply any limitation to the scope of protection, the targeted material could be referred to as being boiled away. An advantage of this approach is that it may enable rapid removal of relatively large amount of target material. However, the peripheral heat affected zone (HAZ) damage and the presence of some recast material after processing present limitations in terms of heat confinement for precision laser materials engineering.

In the PAI regime, the laser drives multi-photon absorption of light inside the material. This strips electrons from the material, which then explode away due to Coulomb repulsion.

Because PAI involves directly breaking the molecular or atomic bonds that hold the material together, rather than simply heating it, it is intrinsically not a 'hot' process. Since the material is removed in a very short timeframe, the ablated material carries away most of the energy before heat can spread into the surrounding material. These effects may result in a significantly reduced HAZ. Furthermore, this is a clean process and may leave minimal recast material, thereby eliminating the need for elaborate post-processing. The PAI mechanism is compatible with a very broad range

TABLE 5

| Wavelength (nm) | Pulse width range | Focal spot diameter | Repetition rate (KHz) | Average power (W) | Scan speed (mm/s) | Repetition number | Hatch distance (mcm) | Power density (intensity) |
|---|---|---|---|---|---|---|---|---|
| 355 nm, 532 nm or 1064 nm | 1 ns-100 ns | 20 μm-100 μm | 10 kHz-200 kHz | 3-8 | 10-50 | 1-10 | 10-100 | 0.002 GW/cm$^2$ to 3 GW/cm$^2$ |

Good results may be achieved with a power density range of 0.1 GW/cm$^2$ to 3 GW/cm$^2$, with particularly good results for wavelength of 532 nm in the power density range 0.2 GW/cm$^2$ to 1 GW/cm$^2$ for processing in argon. However, highly organised structuring is achieved for laser processing in either air or argon.

of materials, including high band-gap materials that have low linear optical absorption and therefore are difficult to engineer with existing techniques. The PAI mechanism can be considered 'wavelength neutral'; that is, nonlinear absorption can be reduced even if the material is normally transmissive at the laser wavelength.

The PAI mechanism should fundamentally allow for custom design of electron work function of ceramic surfaces. Ceramics usually consist of metallic and non-metallic atoms joined by bonds that are partly ionic and partly covalent, giving them such properties such as hardness, brittleness and resistance to heat. Therefore, it may be of importance to correctly identify parameters that may play a significant role in the light-matter interaction mechanisms in these materials and ultimately contribute to challenges of the laser precision structuring processes and the design of the surface potential of ceramic surfaces.

Figures 17A, 17B:
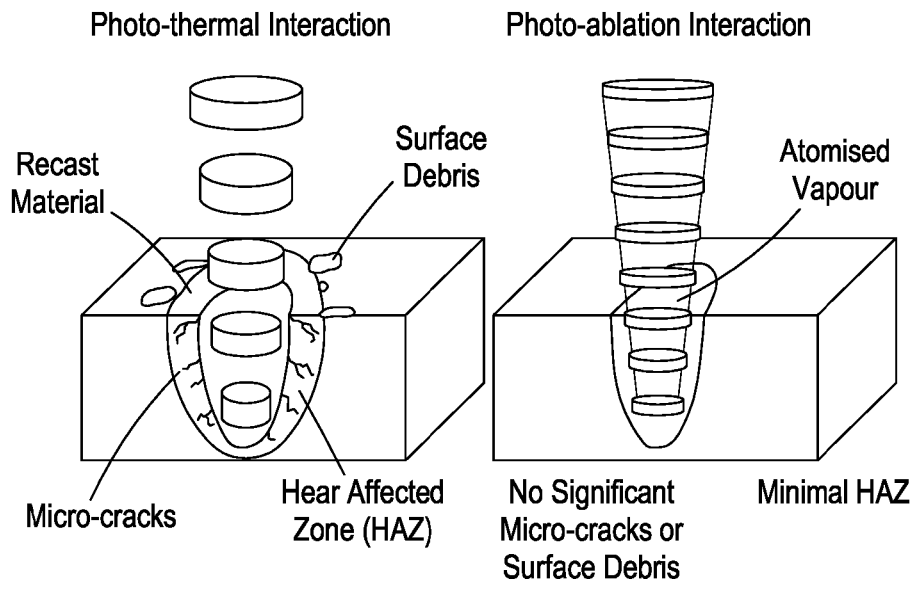
FIGS. 17a and 17b are schematic illustrations of photo-thermal interaction (PTI) and photo-ablation interaction (PAI) mechanisms.

The PTI and PAI mechanism are illustrated schematically in FIGS. 17a and 17b respectively.

It is a further feature of embodiments that the characteristics of the pulsed radiation that is applied to the surface, for example the use of pulse durations in the picosecond range or less, may be such that the periodic structures that are formed may be of shallower depth and/or more gently sloped than features formed using pulsed radiation of higher energy and/or longer duration for example pulse durations in the nano-second range.

Again without wishing to be bound by theory, and without limitation to the scope of protection, the following further comments are provided which relate to processes which may occur in relation to at least some embodiments.

In irradiation at very high intensities (or high irradiance) one is confronted with the issue of a dense, strongly absorbing material, in the first few tens of nm of which energy at a rate of some $10^{20}$ W/cm$^3$ is liberated. Part of this energy, once randomised, is conducted into the bulk of the material, while part is converted into directed kinetic energy by thermal expansion of the heated layer. Two regimes are distinguished in this respect.

1. Nanosecond pulsed laser interaction which is dominated by the expansion and ablation of material. Here the thermal pressure of the heated layer is sufficient to cause significant compression of the underlying target material.

2. Picosecond pulsed laser interaction (which is heat conduction dominated since hydrodynamic motion during the pulse duration is negligible (laser pulses here may be 1000 times or more shorter than nanosecond ones). In the picosecond regime the strong heating of the dense material may occur before hydrodynamic expansion of the processed layer has even started. The plasmas produced in this regime may have essentially the same density as the solid target itself. This—upon cooling—leads to the formation of fine structures—in the range from 1 micrometres to 50 micrometres depending on the irradiation parameters—covered with nano-structures.

Using picosecond duration pulsed radiation according to some embodiments can in some cases also cause formation of nano-ripples or other small scale structures on the surface in addition to the larger scale peaks and troughs obtained by scanning the laser beam in an appropriate pattern over the surface. It is possible that such nano-ripples or other small scale structures may in some cases decrease the PEY or SEY further, in addition to the reduction obtained by larger periodic peak and trough structures. Furthermore, in some cases the nano-ripples or other small scale structures and/or the shallower peaks and troughs associate with picosecond rather than nanosecond pulses may also provide improved or alternative electrical properties of the surface, for example reduced induction, and/or can provide the surface with an increased area at the nano- or micro-scale.

Again, without wishing to be bound by theory, and without limitation to the scope of protection, further comments are as follows.

With increasing surface roughness the maximum SEY may decrease for a surface characterized by (for example statistically containing) more valleys, while it may increase significantly at a surface spread with (for example statistically containing) more hills. The observation indicates that hill and valley structures may be very effective in increasing and decreasing the SEY, respectively, due to their different morphologic features and surface electron work functions (EWF).

The total SEY may denote the ratio of both emitted true secondary electrons (SEs) and backscattered electrons (BSEs) to primary electrons (PEs) incident to the surface.

Example: Sample surfaces exposed to air can be easily contaminated by adsorbed gases and hydrocarbons, and their SEY may increase.

High SEY caused by contaminations should be likely to give rise to the electron multiplication and eventually degrades the performance of microwave devices and the destructive electron-cloud instability in large particle accelerators.

Increase in SEY indicates the reduction in electron work function (EWF).

With increasing roughness $SEY_{max}$ has a significant increase for surfaces that are spared by hills. This phenomenon implies that hill structures should play a positive role in the SE emission. Moreover, $SEY_{max}$ decreases rapidly by surfaces that are mainly characterized by valleys, which should be the dominant factor of the reduction in $SEY_{max}$.

In the case of valley structures, SEs can be trapped effectively through collisions with sidewalls, thus the SEY declines. Nevertheless, for hill structures, apart from the negative effect of sidewalls, there are some positive effects on SE emission. For example, some PEs strike the local surfaces with hills obliquely, which will induce more SEs than normal incidence. Additionally, SEs are likely to re-enter sidewalls of the hills, resulting in further SEs generations. Most re-entered SEs should be the BSEs those with high energies to overcome the surface potential barrier and generate plenty of true SEs with low energies escaping to the vacuum.

Changes in the electron work function (EWF) induced by different surface morphologies may also be responsible for the SEY variations. The work function may decrease at surface peaks and increases at surface valleys with increasing the surface roughness. Hills and valleys in our structuring work may be considered as surface peaks and valleys. A rougher surface introduced by hill structures often has a lower electron work function (EWF), thus the SEY naturally increases. However, the EWF will be enhanced by roughing a surface with valley structures, and finally the SEY decreases.

Figure 18:
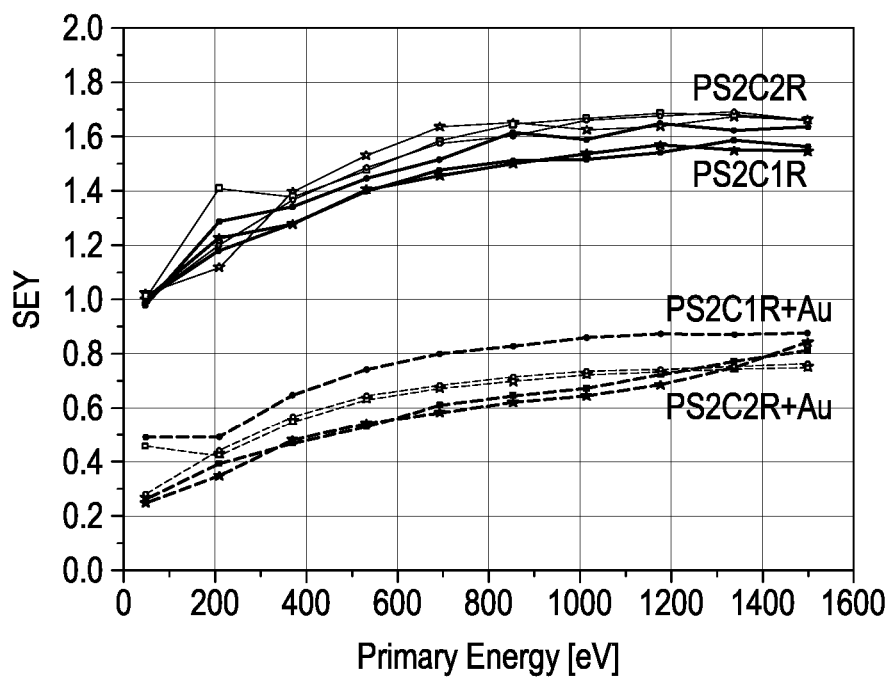
FIG. 18 is a plot of measurements SEY as a function of primary energy for alumina ceramic samples, both before and after coating with a layer of gold.

It has been found that forming of a metal layer on the ceramic surface after the laser treatment that forms the periodic structures can result in a significant reduction of SEY. FIG. 18 is a plot of measurements SEY as a function of primary energy for the alumina ceramic samples with sample names PS2C1R and PS2C1R mentioned above, both before and after coating with a layer of gold of 10 nm thickness. It can be seen that there is a significant reduction of SEY for both samples.

Figure 19:
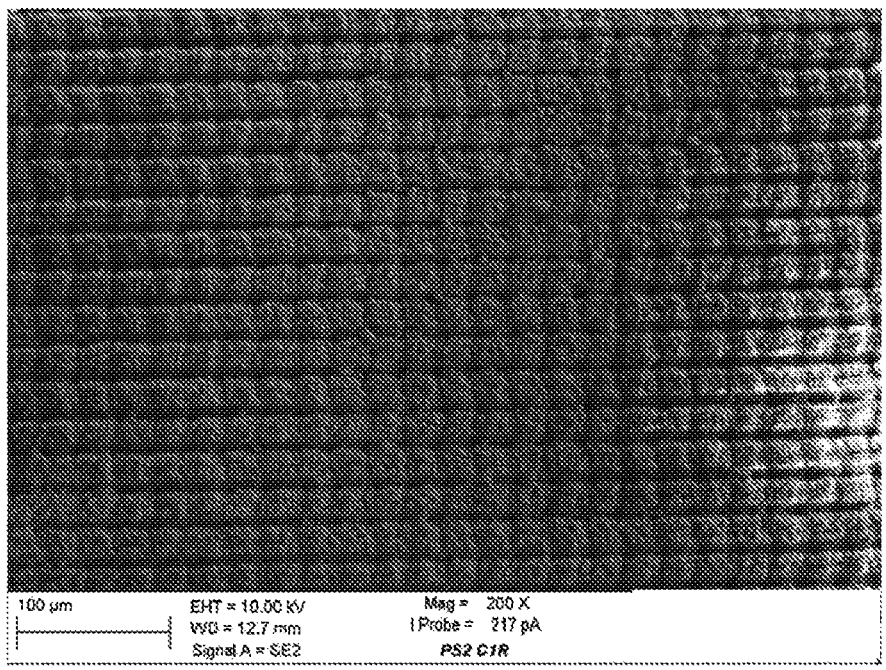
FIGS. 19 and 20 are SEM images of the surfaces of the samples that are the subject of FIG. 18.
Figure 20:
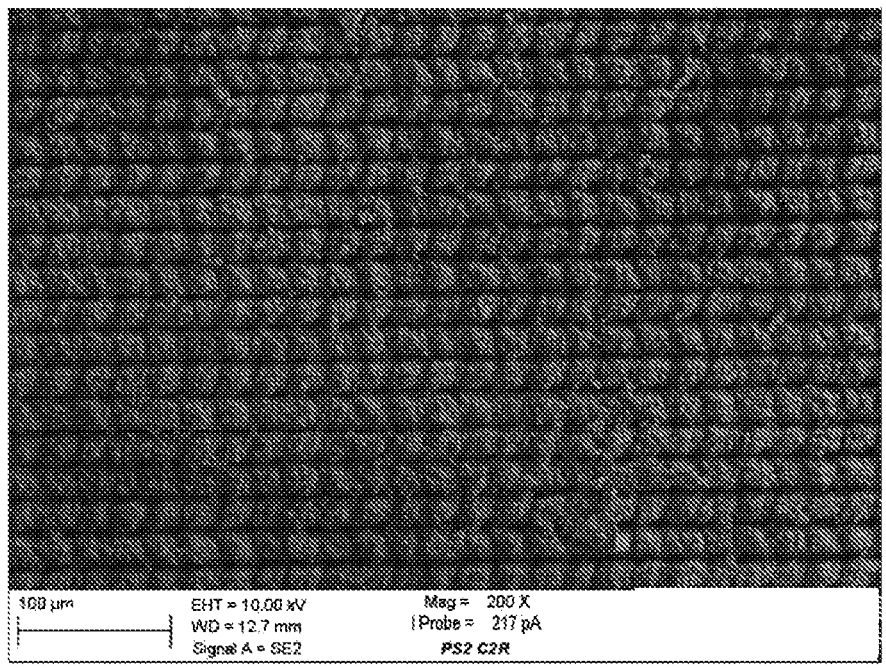

FIGS. 19 and 20 show SEM images of the surfaces of the PS2C1R and PS2C1R alumina sample after coating with the gold layer.

In alternative embodiments any other suitable metal of any other suitable thickness may be used for the metal layer on the ceramic surface.

The layer of gold or other metal may be formed using any suitable deposition process, for example any suitable chemical or physical vapour deposition process, for instance a sputtering process, an evaporative deposition process or a laser deposition process. By way of example, an Edwards® 308 coating unit may be used to form the coating. Any other suitable deposition apparatus may be used.

In alternative embodiments, the ceramic surface, or a metal layer deposited on the ceramic surface may be subject to a degreasing, cleaning or smoothing process and/or a surface carbon reduction process after the applying of the laser radiation, which may result in a decrease in SEY. Cleaning using an NGL® degreasing product may be used. Any suitable degreasing, cleaning, smoothing or surface carbon reduction process may be used in alternative embodiments. The degreaser may, in some embodiments, be such as to not change substantially the morphology of the sample but may remove a layer of carbon or carbon-containing compounds, mixtures or other materials or other undesired and/or extraneous compounds, mixtures or materials from the surface, for example metal oxides, grease or dirt. For example, in some embodiments 99.7% glacial acetic acid (any other suitable concentration may be used) may be used for example at room temperature to remove surface materials, for example copper (I) and copper (II) oxides and/or other materials without substantially changing the surface morphology.

It will be understood that the present invention has been described above purely by way of example, and modifications of detail can be made within the scope of the invention. Each feature in the description, and (where appropriate) the drawings may be provided independently or in any appropriate combination with any other such feature.

The invention claimed is:

1. A method, comprising:
applying pulsed laser radiation comprising a series of laser pulses to a ceramic surface to produce a periodic arrangement of structures on the surface, wherein
a power density of the pulses is in a range 0.1 GW/cm$^2$ to 3 GW/cm$^2$ or in a range 0.1 TW/cm$^2$ to 3 TW/cm$^2$;
a pulse duration of the laser pulses is in a range 300 femtoseconds (fs) to 100 nanosecond (ns);
the pulsed radiation has a pulse repetition rate in a range 10 kHz to 1 MHz;
an average power of the laser radiation is in a range 0.1 W to 10 W;
the pulsed laser radiation comprises a pulsed laser beam that has a focal spot diameter on the surface in a range 1 μm to 100 μm.

2. A method according to claim 1, wherein a power density of the pulses is in a range 0.5 TW/cm$^2$ to 1.5 TW/cm$^2$.

3. A method according to claim 1, wherein a power density of the pulses is in a range 0.2 GW/cm$^2$ to 1 GW/cm$^2$.

4. A method according to claim 1, wherein the applying of the pulsed laser radiation comprises altering the properties of the ceramic surface such that the ceramic surface has a value of SEY less than 2.5.

5. A method according to claim 1, wherein the laser pulses have a duration less than a thermal relaxation time of a material of the ceramic surface.

6. A method according to claim 1, wherein a pulse duration of the laser pulses is in a range 300 femtoseconds (fs) to 1 nanosecond (ns).

7. A method according to claim 1, wherein the pulse duration is in a range 1 ps to 100 ps.

8. A method according to claim 1, wherein the periodic arrangement of structures on the ceramic surface comprises a periodic series of peaks and troughs substantially parallel to each other.

9. A method according to claim 1, wherein a peak to trough distance for at least some of the peaks, and/or an average or median peak to trough distance, is in a range 1 μm to 100 μm.

10. A method according to claim 1, wherein the periodic arrangement of structures comprises a cross-hatched arrangement or an arrangement of substantially parallel lines of peaks and troughs substantially without cross-hatching.

11. A method according to claim 1, wherein the periodic arrangement of structures is produced by a single pass of a laser source that provides the pulsed laser radiation.

12. A method according to claim 1, wherein the laser radiation comprises a pulsed laser beam that has a focal spot diameter on the ceramic surface in a range 5 μm to 100 μm or in a range 1 μm to 100 μm.

13. A method according to claim 1, wherein an average power of the pulsed laser radiation is in a range 3 W to 8 W or in a range 1 W to 10 W, or in a range 0.3 W to 2 W, or in a range 1 W to 5 W, or in a range 0.1 W to 1 W, or in a range 0.1 W to 2 W, or in a range 0.3 W to 5 W.

14. A method according to claim 1, wherein the applying of the pulsed laser radiation to the ceramic surface comprises scanning a pulsed laser beam over the ceramic surface, and a scan speed for the scanning is in a range 1 mm/s to 200 mm/s.

15. A method according to claim 14, wherein the scanning of the pulsed laser beam over the ceramic surface is repeated between 2 and 10 times, or is performed once.

16. A method according to claim 1, wherein an angle of incidence of the pulsed laser radiation to the ceramic surface is in a range from 0 to 30 degrees, or from 90 degrees to 60 degrees.

17. A method according to claim 1, wherein a wavelength of the radiation is in a range 100 nm to 2,000 nm.

18. A method according to claim 1, wherein the periodic arrangement of structures comprises a first series of peaks and troughs arranged in a first direction, and a second series of peaks and troughs arranged in a second direction, different from the first direction.

19. A method according to claim 18, wherein the first series of peaks and troughs and the second series of peaks and troughs intersect such that the periodic arrangement of structures comprises a cross-hatched arrangement.

20. A method according to claim 1, wherein applying the pulsed laser radiation to the ceramic surface comprises producing further structures, wherein the further structures are smaller than the structures of the periodic arrangement of structures.

21. A method according to claim 20, wherein the further structures comprise further periodic structures.

22. A method according to claim 20, wherein the further structures comprise nano-ripples or laser induced periodic surface structures (LIPPS).

23. A method according to claim 20, wherein the further structures have a periodicity in a range 10 nm to 1 μm.

24. A method according to claim 20, wherein the further structures cover at least part of the periodic arrangement of structures and/or are formed in troughs and/or on peaks of the periodic arrangement of structures.

25. A method according to claim 1, wherein the ceramic surface forms part of a laminated structure.

26. A method according to claim 1, wherein the ceramic surface forms part of a particle accelerator, an injection kicker system, a beamline, a waveguide, a detector, a detector apparatus, a spacecraft, or a vacuum chamber.

27. A method according to claim 1, wherein the ceramic surface comprises a surface of a component of an apparatus, and the method further comprises applying the pulsed laser radiation to the surface of the component of the apparatus to produce the periodic arrangement of structures on the surface of the component of the apparatus and then installing the component in the apparatus, or the method further comprises applying the pulsed laser radiation to the surface of the component of the apparatus with the component in situ in the apparatus.

28. A method according to claim 1, further comprising forming a metal layer on at least part of the ceramic surface after the applying of the pulsed laser radiation.

29. A method according to claim 1, further comprising at least one of degreasing, cleaning or smoothing the surface after the applying of the pulsed laser radiation and/or performing a surface carbon reduction process with respect to the ceramic surface after the applying of the pulsed laser radiation.

\* \* \* \* \*

UNITED STATES PATENT AND TRADEMARK OFFICE
CERTIFICATE OF CORRECTION

PATENT NO. : 10,994,369 B2
APPLICATION NO. : 16/082163
DATED : May 4, 2021
INVENTOR(S) : Amin Abdolvand It is certified that error appears in the above-identified patent and that said Letters Patent is hereby corrected as shown below:

On the Title Page

Item [30], delete "1603991" and insert -- 1603991.9 --

In the Specification

Column 10, Line 49: delete "laser (r)" and insert -- laser (T) --

Column 16, Lines 41-42: delete the paragraph break between "repulsion." and "Because"

Signed and Sealed this
Fifth Day of July, 2022

Katherine Kelly Vidal
*Director of the United States Patent and Trademark Office*